(12) United States Patent
Bennett et al.

(10) Patent No.: US 6,711,797 B1
(45) Date of Patent: Mar. 30, 2004

(54) HYDRAULIC TOOLING FIXTURE

(75) Inventors: Ricky Paul Bennett, Flemington, NJ (US); Charles D. Moncavage, Easton, PA (US); Bernward Starke, Dorset (GB); Jason Mark Edelstein, Dorset (GB); Ian Gordon Wood, Dorset (GB)

(73) Assignee: Dek International GmbH, Zurich (CH)

( * ) Notice: Subject to any disclaimer, the term of this patent is extended or adjusted under 35 U.S.C. 154(b) by 0 days.

(21) Appl. No.: 09/524,764

(22) Filed: Mar. 13, 2000

Related U.S. Application Data

(63) Continuation-in-part of application No. 09/337,895, filed on Jun. 21, 1999, now abandoned.

(51) Int. Cl.[7] .......................... B25B 27/14; B23Q 7/00; B23Q 3/00; B21C 51/00
(52) U.S. Cl. .................... 29/281.6; 29/559; 72/20.1; 269/20
(58) Field of Search .................... 29/559, 281.6; 72/20.1, 21.1, 21.4, 21.5, 28.1, 453.13; 269/20, 21, 22, 24, 27, 28; 137/101.11, 154; 417/460; 477/33; 251/12, 43, 45

(56) References Cited

U.S. PATENT DOCUMENTS

| | | | |
|---|---|---|---|
| 3,795,110 A | * | 3/1974 | Kobelt .................... 60/413 |
| 4,170,971 A | | 10/1979 | Yamanaka et al. |
| 4,635,466 A | * | 1/1987 | Seki et al. ............... 72/453.13 |
| 5,157,438 A | | 10/1992 | Beale |
| 5,551,677 A | | 9/1996 | Puettmer et al. |
| 5,687,598 A | * | 11/1997 | Kirii et al. .................... 72/21.5 |
| 5,752,446 A | | 5/1998 | Squibb |
| 5,761,951 A | | 6/1998 | Codatto |
| 6,029,966 A | | 2/2000 | Hertz et al. |
| 6,032,788 A | | 3/2000 | Smithers et al. |
| 6,202,999 B1 | | 3/2001 | Wayman et al. |

FOREIGN PATENT DOCUMENTS

| | | |
|---|---|---|
| EP | 0 499 386 A2 | 8/1992 |
| EP | 0 954 211 A2 | 3/1999 |
| GB | 2 322 089 B | 3/1999 |
| JP | 7022794 | 1/1995 |
| WO | WO 00/08905 | 2/2000 |

* cited by examiner

*Primary Examiner*—John C. Hong
(74) *Attorney, Agent, or Firm*—Shanks & Herbert

(57) ABSTRACT

A tooling fixture includes a plurality of cylinders in a module fitted with pistons in which a portion thereof extends from the surface of the module. The cylinders are connected with a fluid source by a control valve assembly. The control valve assembly controls the amount of fluid to enter the cylinders in order to raise the pistons until a portion thereof are in contact with and support a workpiece. Once all of the pistons are in contact with and are fully supporting the workpiece, the fluid pressure is stabilized, maintaining the pistons at their set heights.

Once the pistons are desired to be lowered, the valve assembly opens and the fluid can freely exit the cylinders and retract the pistons back into the module.

67 Claims, 16 Drawing Sheets

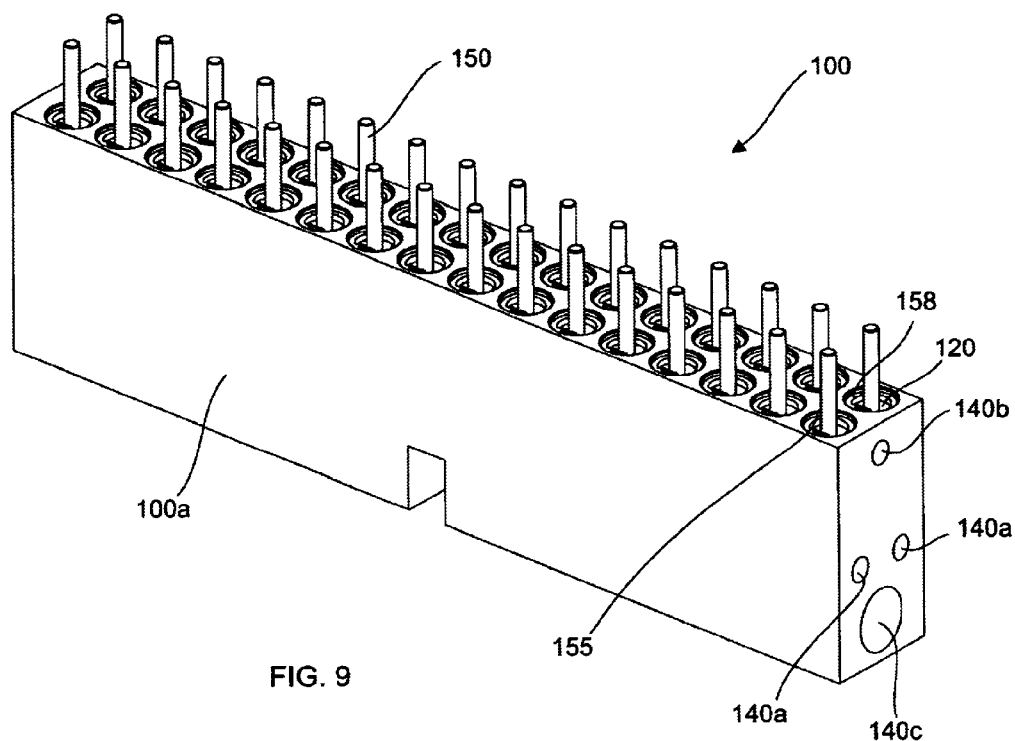
FIG. 9
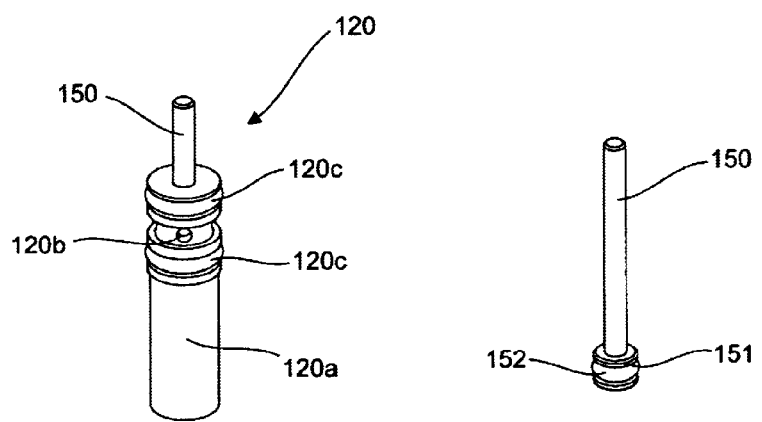
FIG. 10
FIG. 11

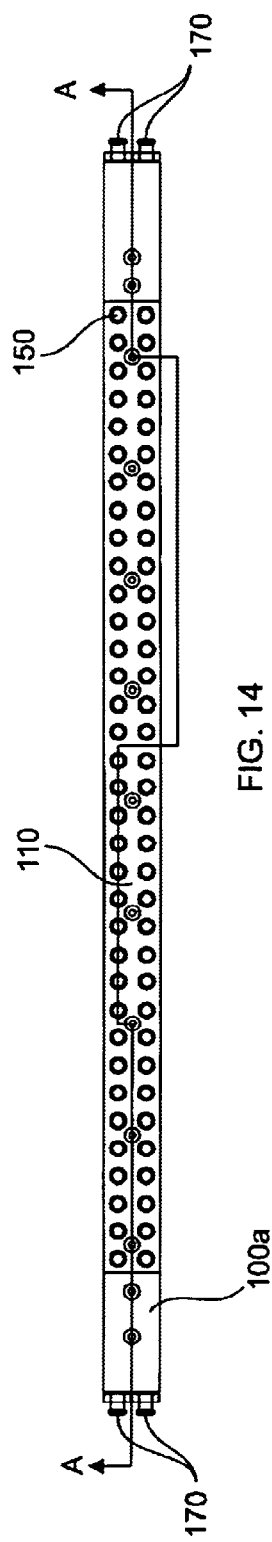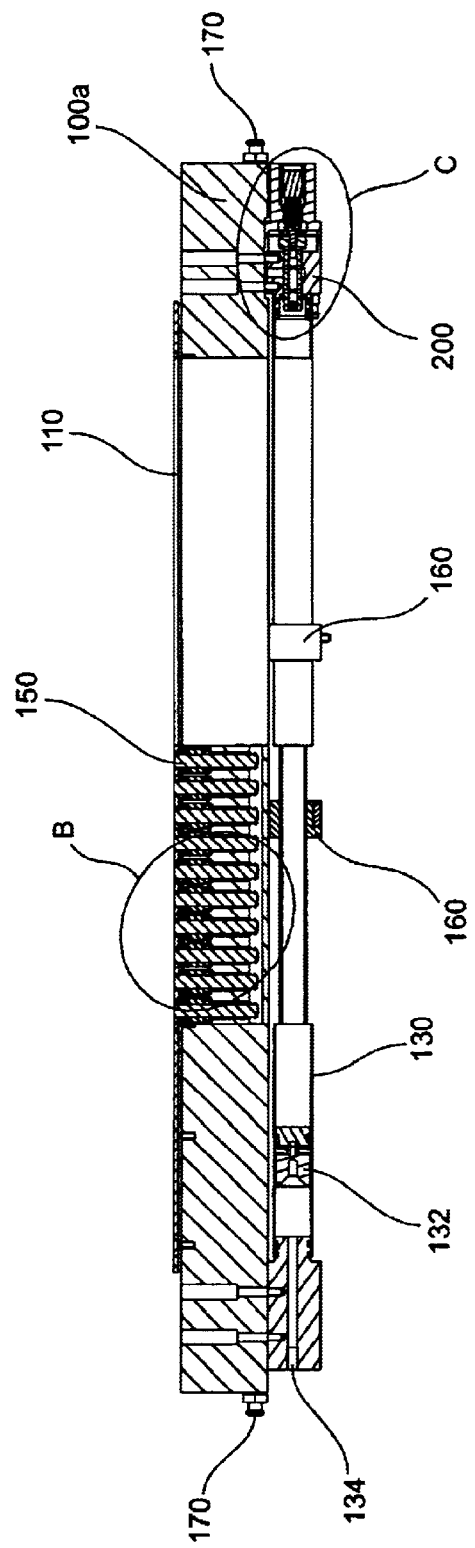

HYDRAULIC TOOLING FIXTURE

This application is a continuation in part of U.S. application Ser. No. 09/337,895 filed Jun. 21, 1999, now abandoned which is incorporated herein by reference in its entirety.

FIELD OF THE INVENTION

This invention relates to a tooling fixture to support a workpiece. In particular, this invention relates to a hydraulic fixture for supporting a flexible substrate such as a printed circuit board to be used in a screen printing machine or placement machine.

BACKGROUND OF THE INVENTION

Fabrication of large volumes of electronic circuitry is economically accomplished using automated equipment. According to one known process a viscous solder paste is applied to selected areas of a printed circuit board through a stencil in a screen printing machine. Electronic components are then placed on the applied solder paste using a placement machine (also known as a pick-and-place machine). The printed circuit board and components are then heated in a reflow oven to a temperature sufficient to melt the paste, causing it to flow over the leads of the components and adjacent areas of the printed circuit board, thereby forming solder joints and completing the electronic circuit.

Within the screen printing machine a pair of conveyor belts support the printed circuit board by its edges. The conveyor belts move the board into the machine and position it relative to the stencil. A tooling fixture below the underside of the board is raised so that it presses upward on the lower surface of the board t) provide support for the board during the printing process. The board and tooling are then raised until the top surface of the board contacts the stencil. A printhead applies the solder paste to the top surface of the stencil and presses the paste against the stencil. Pressure applied by the printhead forces solder through holes in the stencil and onto the top surface of the board. The tooling fixture prevents the board from flexing away from the stencil as pressure is applied by the printhead.

Conveyor belts also move the circuit board through the placement machine. After solder is applied to the board by the screen printing machine, the board is moved into the placement machine and positioned relative to a robotic pick-and-place head. A tooling fixture located below the board is raised to support the underside of the board. Under the control of a program that defines the proper location of each of the components of the circuit, the pick-and-place head sequentially presses each component onto its proper location on the printed circuit board. The tooling fixture prevents the board from flexing as pressure is applied by the pick-and-place head.

Where components are placed on only one surface of the board, the tooling fixtures merely have to support a flat surface, and only slight modifications to the fixtures need to be made to accommodate boards with different linear dimensions. However, in order to better utilize the surface area of printed circuit boards and produce more compact circuitry, components are often placed on both surfaces of the board. In such cases, after components have been applied to one side of the board, the board is then turned over and components are placed on the other side of the board. Consequently, a second tooling fixture is required that conforms to the three-dimensional surface created by the components placed on the board. Since each different circuit layout has a different three-dimensional shape, this second tooling fixture must be customized for each layout.

One way to provide a customized, three-dimensional tooling fixture is to manually assemble blocks on the top surface of the tooling fixture that are arranged to contact the portions of the board not populated by components. However, this method is time consuming because an operator must reposition the blocks each time a different board is processed. This method is particularly cumbersome when a large number of different types of circuit boards are fabricated on the same assembly line.

Another method is to provide an array of electronically addressable posts that are either retracted in positions where a component is attached or extended where they can contact the board surface to provide support. A computer program directs the tooling fixture to configure the posts to conform to each printed circuit board that is fabricated. This method provides a faster means to change from one tooling configuration to another than the manual assembly of blocks. However, a separate computer database must be created for each layout of each board. Further, since no support is provided to the board in areas covered by components, certain portions of the board may be inadequately supported. Unsupported portions of the board may flex during processing resulting in misalignment between the stencil or the pick-and-place head and the board.

Yet another method is to provide a robot mechanism to automatically take support pillars from a reservoir and place them in the required positions to support the board. This method is faster and more consistent than manually placing support blocks, but needs a separate computer database for each board type to define where pillars should be placed and can only provide support where there is clear space on the board for the pillar.

Prior to using a customized fixture with a new board layout, an operator must carefully inspect the fit between the tooling fixture and the board to make certain that misalignment and dimensional tolerances do not cause an extended post, positioned pillar, or a manually positioned block to contact a component. Such contact will cause the tooling fixture to flex the board upward resulting in misplacement of the solder paste or components. More importantly, flexure of the board upward against the stencil can cause damage to the stencil or printhead of the screen printing machine.

Inspection of the tooling fixture each time a new type of board is fabricated complicates the manufacturing process and lowers throughput. Further, if the operator fails to properly inspect the fit between the board and the fixture, large numbers of misaligned boards may be produced or costly damage to the equipment may result.

Furthermore, even when a fabrication line produces only a single type of printed circuit board, each side of the board requires a different tooling fixture surface. A "flat" tooling fixture supports the unpopulated side of the board while the first side is screen printed and populated with components, and then a customized fixture supports the now populated side while the second side of the board is screen printed and populated. Even this tooling change reduces the throughput of the fabrication line.

SUMMARY OF THE INVENTION

In view of the above-identified problems with know methods for forming tooling fixtures, it is an object of the present invention to provide a tooling fixture that conforms to an uneven surface without having been configured beforehand.

It is another object of the invention to provide a tooling fixture that supports an uneven surface formed by a printed circuit board with components fixed thereon within a screen printing machine.

It is yet another object of the invention to provide a tooling fixture that supports an uneven surface formed by a printed circuit board with components fixed thereon within a placement machine.

It is still a further object of the invention to provide a tooling fixture that adapts to the surface of populated and unpopulated printed circuit boards.

It is still a further object of the invention to provide a tooling fixture that supports a workpiece using an array of hydraulic cylinders driving a respective array of pistons.

It is still a further object of the invention to provide a tooling fixture that supports a workpiece using an array of bearing and seal assemblies for directing an array of support rods to be driven.

According to one aspect of the present invention a block is provided with a plurality of cylinders. Each cylinder surrounds a piston that drives a rod extending out of the top surface of the block. The cylinders are connected with a pressure sensor and an accumulator. A controllable valve is connected between the accumulator and the cylinders. Opening the valve allows hydraulic fluid to flow between the cylinders and the accumulator. The pressure sensor monitors the hydrostatic pressure of the hydraulic fluid in the cylinders. A compressed air source is connected to the accumulator through a further valve, such that when this valve is opened a force is generated to drive fluid into the cylinders, thereby causing the pistons to extend from the block. Similarly a vacuum source is also connected to the accumulator through a third valve, such that with this valve open and the compressed air valve closed, a vacuum is applied to the accumulator to draw fluid from the cylinders, thereby causing the pistons to retract into the block. The pressure sensor and the valve are connected with a controller that opens and closes the valve in response to a control sequence and the hydrostatic pressure in the cylinders.

The tooling fixture according to this aspect conforms to an uneven surface as follows. The controller opens the fluid valve and the vacuum valve to draw fluid from the cylinders causing the pistons to retract the rods into the block. A workpiece is positioned above the fixture. The workpiece can be substantially flat or can have three-dimensional structures fixed thereon. According to one embodiment, the workpiece is a printed circuit that is either populated with components or else unpopulated. The controller closes the vacuum valve and opens the compressed air valve, forcing fluid into the cylinders and raising the rods. When all of the rods have contacted the surface of the workpiece, the pressure of the fluid sensed by the pressure sensor rises. When this pressure reaches a predetermined threshold, the controller closes the fluid valve and the compressed air valve, and the positions of the rods are fixed. Force applied to the top surface of the workpiece, for example by the printhead of a screen printing machine, is opposed by the rods and deflection of the workpiece is prevented.

According to another embodiment of the present invention a tooling fixture module is provided with a plurality of cylinders. Each cylinder surrounds a piston wherein a portion of the piston extends out of the top surface of the module. The cylinders are connected with a fluid reservoir and pressure source. A control valve assembly is connected between the fluid reservoir and the cylinders. Opening the valve permits fluid to flow between the cylinders and the fluid reservoir, providing for raising or lowering the pistons.

The tooling fixture according to this aspect conforms to an uneven surface as follows. Pneumatic pressure acts on a main piston, located within a fluid source. The fluid then acts on a control valve while in its open position in order to provide fluid to the cylinders of the module, causing a portion of the pistons to extend out of the module body. A workpiece is positioned above the tooling fixture. The workpiece can be substantially flat or can have three-dimensional structures fixed thereon. This workpiece can be a printed circuit that is either populated with components or else unpopulated. Each piston that makes contact with the workpiece will remain in this contact position while the other pistons continue to extend out of the module. After all of the pistons have made contact with the workpiece, the control valve closes, preventing the fluid from further entering or leaving the cylinders, thus effectively locking the pistons in a fixed position. Force applied to the top surface of the workpiece, for example, by the printhead of a screen printing machine is opposed by each piston, and deflection of the workpiece is prevented. In order to lower the pistons, the control valve opens, allowing the fluid to exit the cylinders through the valve, and the pistons will retract back into the module.

According to another embodiment of the invention, the fluid source can be in the form of a hydraulic tube containing a first main piston therein for forcing fluid towards the control valve and into the cylinders causing the pistons to move upward extending a portion thereof out of the surface of the module.

According to another embodiment of the invention, the hydraulic tube can be replaced with a fluid reservoir.

According to a further embodiment of the invention, a second fluid reservoir is used in conjunction with the first fluid reservoir to force fluid into cylinder sections above the pistons. A second pneumatic pressure source applies pressure directly to the control valve and to the second fluid reservoir simultaneously. Consequently the control valve is opened and allows fluid to flow from the cylinder sections below the pistons into the first fluid reservoir while fluid from the second reservoir is forced into the cylinder sections above the pistons, causing a portion of the pistons to retract into the module. Similarly, a first pneumatic pressure can be applied to the first fluid reservoir in order to force fluid through the control valve and into cylinder sections below the pistons. This will force the fluid contained in the cylinder sections above the pistons back into the second fluid reservoir, thus raising a portion of the pistons out of the module.

According to a further embodiment of the invention the cylinder and piston assemblies are replaced with rod assemblies each containing support rods, integrally connected at their bottom portions by a large singular cavity. Applying a first pneumatic pressure to a main piston within a fluid reservoir will force fluid through a one-way path in a control valve and into the large singular cavity. The fluid in the large singular cavity will force the support rods to extend out of the module until each of the rod makes contact with the workpiece. To retract the support rods, a second pneumatic pressure is applied to the control valve assembly to open a flow path allowing the fluid to flow from the large singular cavity to the fluid reservoir.

According to another embodiment of the invention the control valve is replaced with a permanent aperture between a single reservoir and a large singular cavity below a series of rod assemblies. The single reservoir includes a main piston with main rod connected thereto it. A first pneumatic pressure source acts on the main rod and main piston to extend the combination towards the fluid within the fluid reservoir, forcing the fluid within the fluid reservoir through the permanent aperture and into the large singular cavity, thus raising the rods. A second pneumatic pressure source acts on the main rod and main piston to retract the combination away from the fluid within the fluid reservoir, drawing the fluid out of the large singular cavity and back into the fluid reservoir, thus retracting the rods. A third pneumatic pressure source acts on a clamp provided to prevent or allow the main piston and main rod combination within the reservoir to move. In effect, when pressure is applied to the clamp, the main rod is disengaged and permitted to move upon application of pressure applied to it from either the first or second pneumatic pressure source.

It is to be understood that both the foregoing general description and the following detailed description is exemplary and explanatory and is intended to provide further explanation of the invention claimed.

The accompanying drawings are included to provide a further understanding of the invention and are incorporated in and constitute a part of this specification, illustrate several embodiments of the invention and together with the description, serve to explain the principles of the invention.

Further objects, features, and advantages of the invention will become apparent from the detailed description and drawings that follow.

BRIEF DESCRIPTION OF THE DRAWINGS

FIG. 9 is a perspective view of one embodiment of a single module 100 of the present invention consisting of two rows of support rods 150.

FIG. 10 is an enlarged and detailed view of a perspective cylinder assembly of the present invention.

FIG. 11 is an enlarged and detailed view of a perspective rod to be used within a cylinder assembly of the present invention.

FIG. 14 is a downward view of the second embodiment of module 100 of present invention.

FIG. 15 is a partial sectional view along the line A—A of FIG. 14.

DETAILED DESCRIPTION OF A PREFERRED EMBODIMENT OF THE INVENTION

With respect to the FIGS. 1–21, which illustrate the different embodiments of the present invention, but are not intended to limit the same, the present invention provides an apparatus and method for supporting a workpiece.

Figure 1:
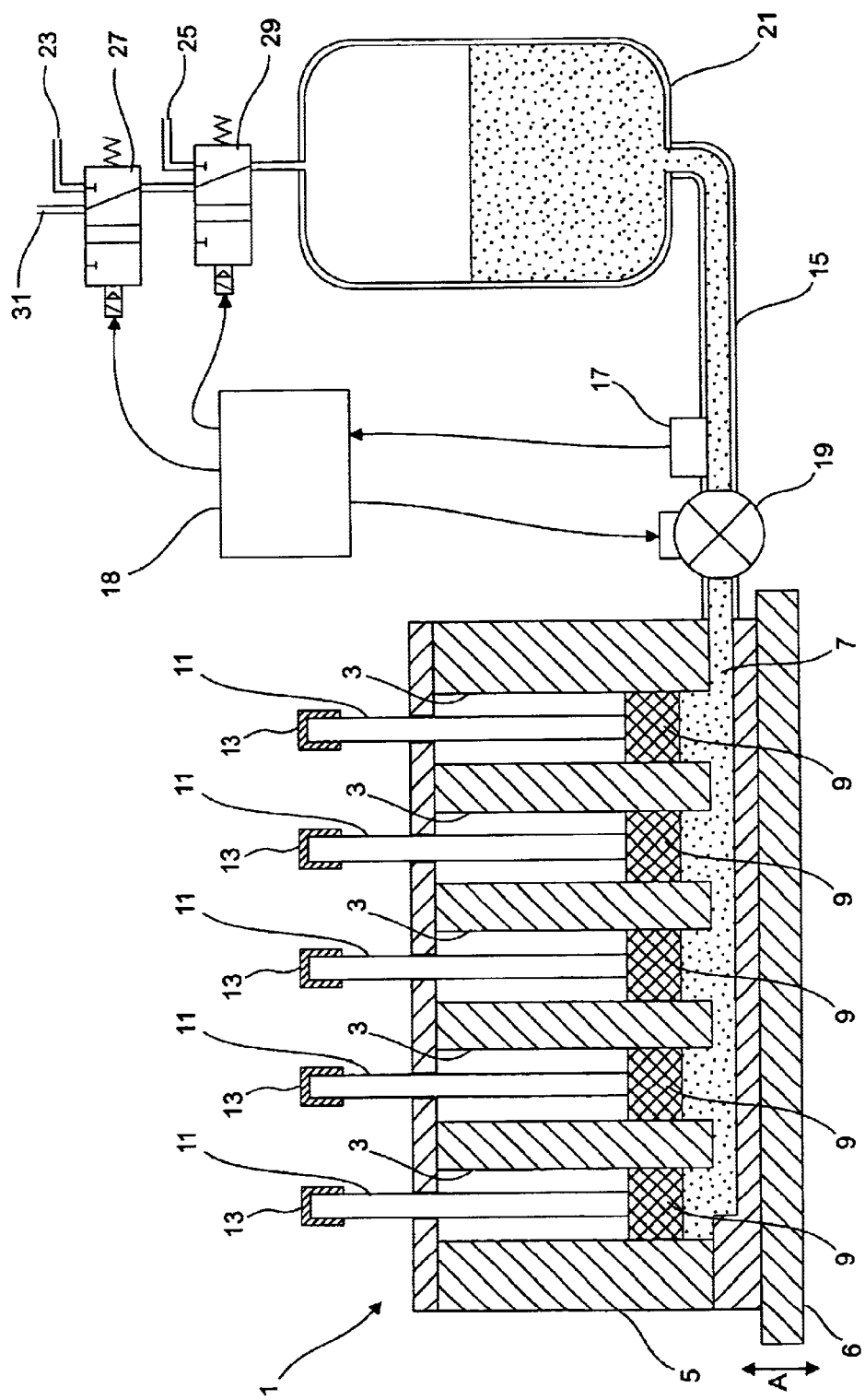
FIG. 1 is a cross-sectional view of a tooling fixture according to one embodiment of the invention.

FIG. 1 shows a cross section of a tool fixture 1 according to a first embodiment of invention. A number cylinders 3 are provided in a fixture block 5. The lower ends of the cylinders are connected with a manifold 7. A piston 9 is provided within each cylinder 3. The pistons 9 fit snugly within the cylinders 3 so that hydraulic pressure within the cylinders 3 will drive the pistons 9. Each piston 9 is connected with a rod 11. Movement of the piston 9 drives the rod 11 into and out of the block 5. Endcaps 13 are provided at the ends of the rods 11. According to one embodiment the endcaps are formed from a relatively soft material, such as a plastic, so that contact between a workpiece and the endcap 13 will not mar the surface of the workpiece. According to another embodiment the endcaps 13 are formed form a material that has a high coefficient of friction so that the workpiece will not tend to slip when in contact with the endcaps 13.

Figure 2:
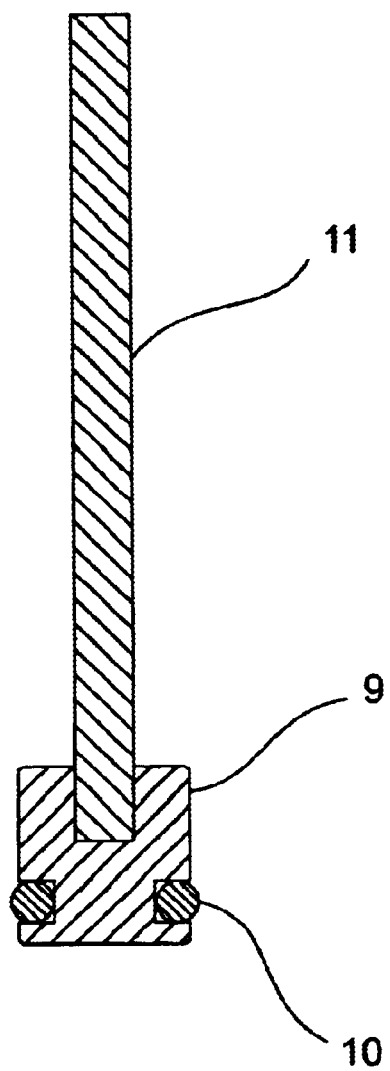
FIG. 2 is a cross-section view of a piston used in conjunction with the embodiment of FIG. 1.

FIG. 2 shows a cross-section of a piston 9 and rod 11 according to an embodiment of the invention. The piston 9 includes an O-ring 10. When the piston 9 is inserted into the cylinder 3, the O-ring 10 forms a slidable seal along the sides of the cylinder 3. The O-ring 10 may be formed form an elastomer, for example, buna rubber. Alternative seal arrangements are possible without departing from the invention.

As shown in FIG. 1, a tube 15 is connected with the manifold 7 by a valve 19. A pressure sensor 17 is connected with the tube 15. The pressure sensor 17 monitors the hydrostatic pressure of fluid in the manifold 7 and cylinders 3 and generates a signal that indicates pressure in the cylinders 3. The pressure signal is monitored by a controller 18. According to one embodiment the pressure sensor 17 is an electronic sensor that generates a voltage which is proportional to the pressure in the cylinders 3. Alternatively, the pressure sensor is a pneumatic or mechanical sensor that generates a pneumatic or mechanical signal that indicates the pressure of the fluid in the cylinders 3. The valve 19 is opened or closed in response to a signal from controller 18. According to one embodiment the valve 19 is a normally-closed valve that is opened by an electrical current provided by the controller 18. Alternatively, the valve 19 is a pneumatic or mechanical valve that is opened or closed in response to a pneumatic or mechanical signal from the controller 18.

The tube 15 is connected with the lower end of an accumulator 21. The accumulator 21 has a second pipe connecting its upper end to a second valve 29. According to one embodiment of the invention, the valve 29 is a three-port valve that can be moved to a first or a second position. When valve 29 is in the first position, it connects the accumulator 21 with a third valve 27. When valve 29 is in the second position, the accumulator 21 is connected through tube 25 to a source of a vacuum (not shown). The vacuum draws fluid into the accumulator 21 from the cylinders 3. According to this embodiment valve 27 is also a three-port valve that can be moved to a first or second position. When valve 27 is in the first position while valve 29 is in the first position, the accumulator 21 is vented to the atmosphere through tube 31. When valve 27 is in the second position and valve 29 is in the first position, the accumulator 21 is connected by tube 23 with a compressed air supply (not shown) that drives fluid from the accumulator 21 to the cylinders 3. According to one embodiment of the invention, valves 27 and 29 are electrically operated valves that, when de-energized, are in their respective first positions.

According to another embodiment, the accumulator 21 includes a drive piston slidable fitted within a master cylinder holding the fluid. The drive piston is coupled to an actuator. In response to signals form the controller 18, the actuator raises the drive piston to draw fluid into the master cylinder from the cylinders 3 and lowers the drive piston to force fluid from the master cylinder to the cylinders 3.

The function of the accumulator 21 is to hold a sufficient volume of fluid to fill the cylinders 3 and manifold 7 when the pistons 9 are driven to the tops of the cylinders 3. The accumulator 21 and valves 19, 27 and 29 function together to supply the fluid to the cylinders 3 under the control of the controller 18. Other arrangements for performing these functions are well known to those skilled in the art and can be substituted while remaining within the scope of the invention.

The fixture block 5 rests on a tooling platform 6. According to one embodiment of the invention, the platform 6 is part of a screen printing machine and can be at a fixed height or moved up or down as indicated by arrow A by the screen printing machine. According to a further embodiment, the platform 6 is part of a placement machine and can be at a fixed height or moved up or down as indicated by arrow A by the placement machine.

According to one embodiment of the invention, the controller 18 is a programmable controller that executes programmed instructions stored in a memory. According to a further embodiment, the controller 18 is computer programmed to monitor and control the functions of a screen printing machine and to direct the operations of the valves 19, 27 and 29 in conjunction with the operation of the screen printing machine. According to another embodiment, the controller 18 is computer programmed to monitor and control the functions of a placement machine.

Figure 3:
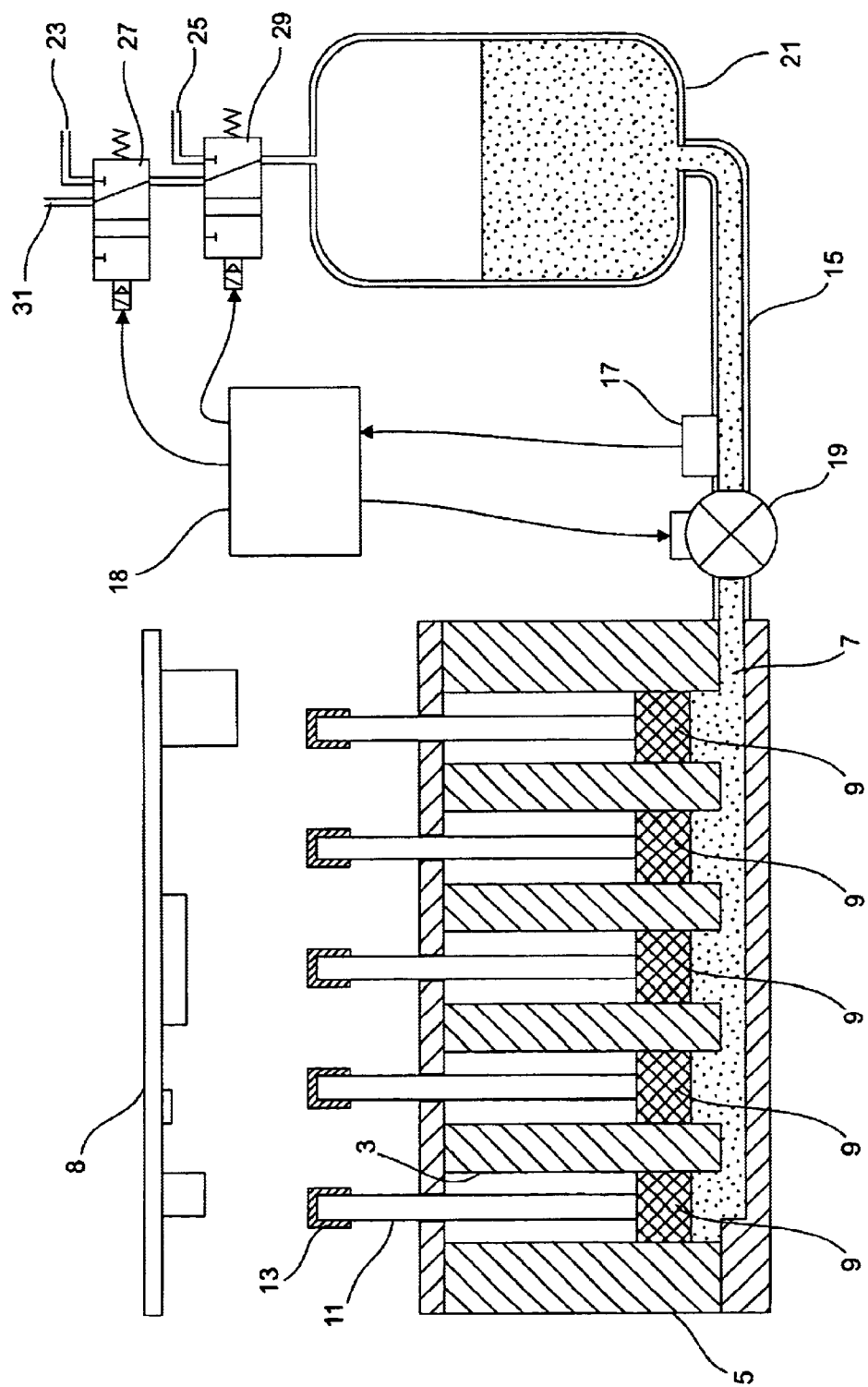
FIGS. 3–5 are cross-sectional views of the embodiment of FIG. 1 illustrating a method of operation according to the embodiment of FIG. 1.

Operation of the tooling fixture 1 according to an embodiment of the invention will be described with references to FIGS. 3–5. As shown in FIG. 3, initially valve 19 is closed and valves 29 and 27 are in their first positions. All of the pistons 9 are at the bottom of the cylinders 3, and rods 11 are withdrawn into the block 5 to enable a workpiece 8 to be positioned above the tooling fixture 1. The workpiece 8 can be substantially flat or can have vertical features. According to one embodiment the workpiece 8 is a printed circuit board with a lower surface populated with electronic components. On command from the screen printer, the controller 18 signals the valve 19 to open and valve 27 to switch to its second position, allowing compressed air to flow to the accumulator 21, thereby causing fluid to flow from the accumulator 21 to the manifold 7 and cylinders 3. Fluid is forced into the cylinders 3, driving the pistons 9 towards the tops of the cylinders 3 and extending the rods 11 from the top of the block 5.

Figure 4:
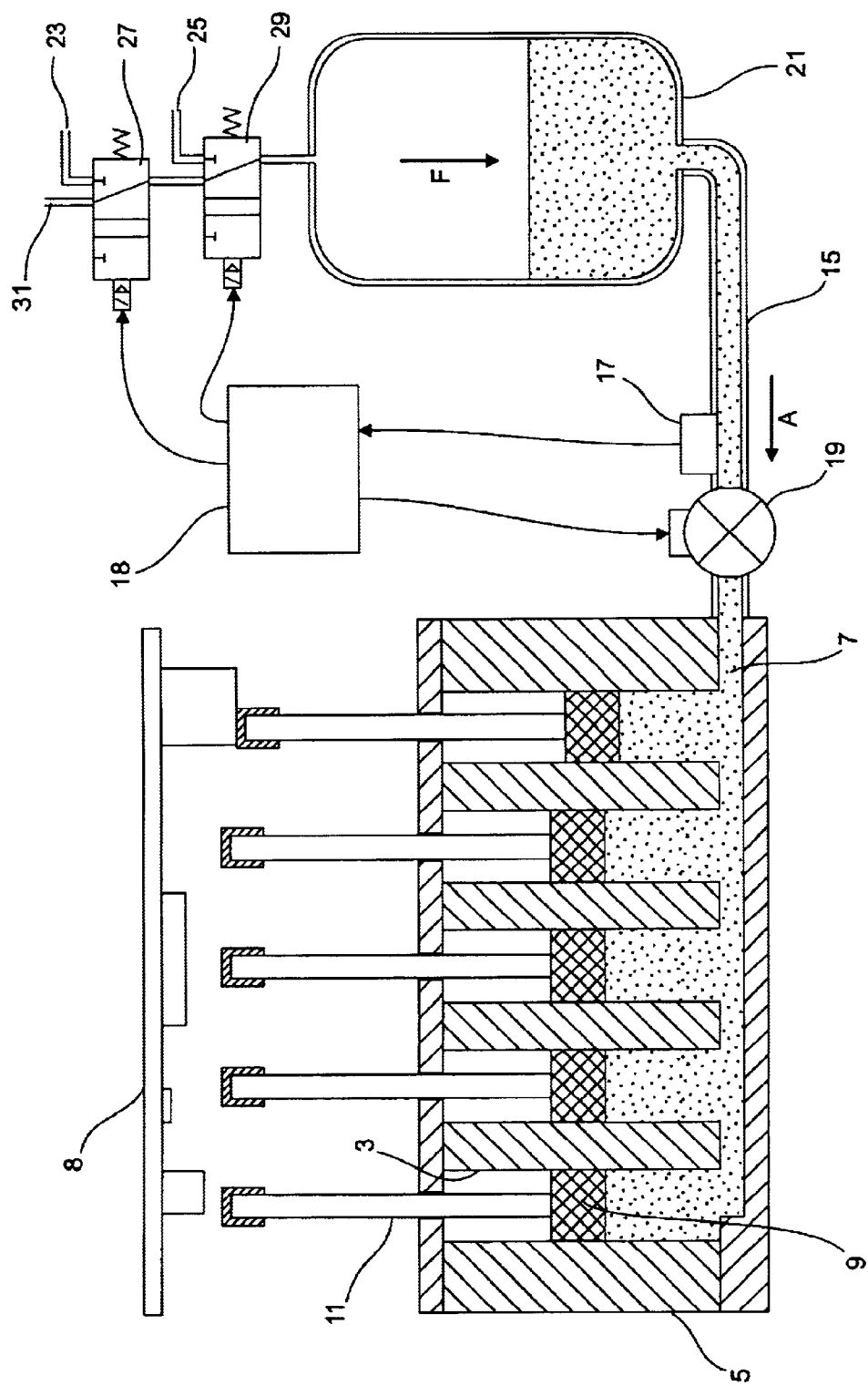

As each rod 11 encounters the surface of the workpiece 8 it will stop while the remaining rods 11 continue to rise, as shown in FIG. 4. When all rods 11 have contacted the surface of the workpiece 8, as shown in FIG. 5, or the corresponding piston 9 reached the top of its cylinder 3, flow of fluid from the accumulator 21 to the manifold 7 will cease and the pressure in the manifold 7 and pipe 15 will increase rapidly. The pressure of the fluid in the manifold 7 and pipe 15 is monitored by the pressure sensor 17. The controller 18 compares the pressure sensed by the sensor 17 with a predetermined threshold. When that threshold is exceeded, the controller 18 closes the valve 19 and switches valve 27 to its first position. With the valve 19 closed, the volume of the fluid in the cylinders 3 and manifold 7 is fixed so that the workpiece 8 will not flex in response to force applied along the row of rods 11 supported by the pistons 9. In addition, force applied to the workpiece 8 at a single point will be resisted by the stiffness due to viscous flow of fluid between cylinders 3.

According to one embodiment of the invention, the workpiece 8 is a printed circuit board within a screen printing machine. After the tooling platform 6 has been raised to bring the upper surface of workpiece 8 into contact with the stencil (not shown) and the valve 19 closed, as shown in FIG. 5, a screen printing head (not shown) applies solder paste to selected portions of the top surface of the board. The screen printing head applies solder paste to the top surface of the printed circuit board along a line. According to this embodiment, the row of cylinders 3 is aligned with the screen printing head so that the force applied by the printing head along the line is resisted by the row of rods 11.

According to another embodiment of the invention, the workpiece 8 is a printed circuit board within a placement machine. After the valve 19 is closed, as shown in FIG. 5, a pick-and-place head (not shown) presses electronic components onto selected areas on the top side of the board. Stiffness due to viscous flow of fluid among the cylinders 3 prevents the board from flexing in response to pressure applied by the pick-and-place head.

When the process that requires applying force to the top surface of the workpiece 8, for example, the screen printing or component placement operation, is complete, the controller 18 opens valve 19 and switches valve 29 to its second position to apply a vacuum to accumulator 21, drawing fluid form the cylinders 3 and retracting the rods 11 into the block 5. After sufficient time to allow all the rods 11 to be retracted, valve 19 is closed and valve 29 is switched to its first position. Then the workpiece 8 is replaced by a next workpiece 8 and the process is repeated.

Figure 5:
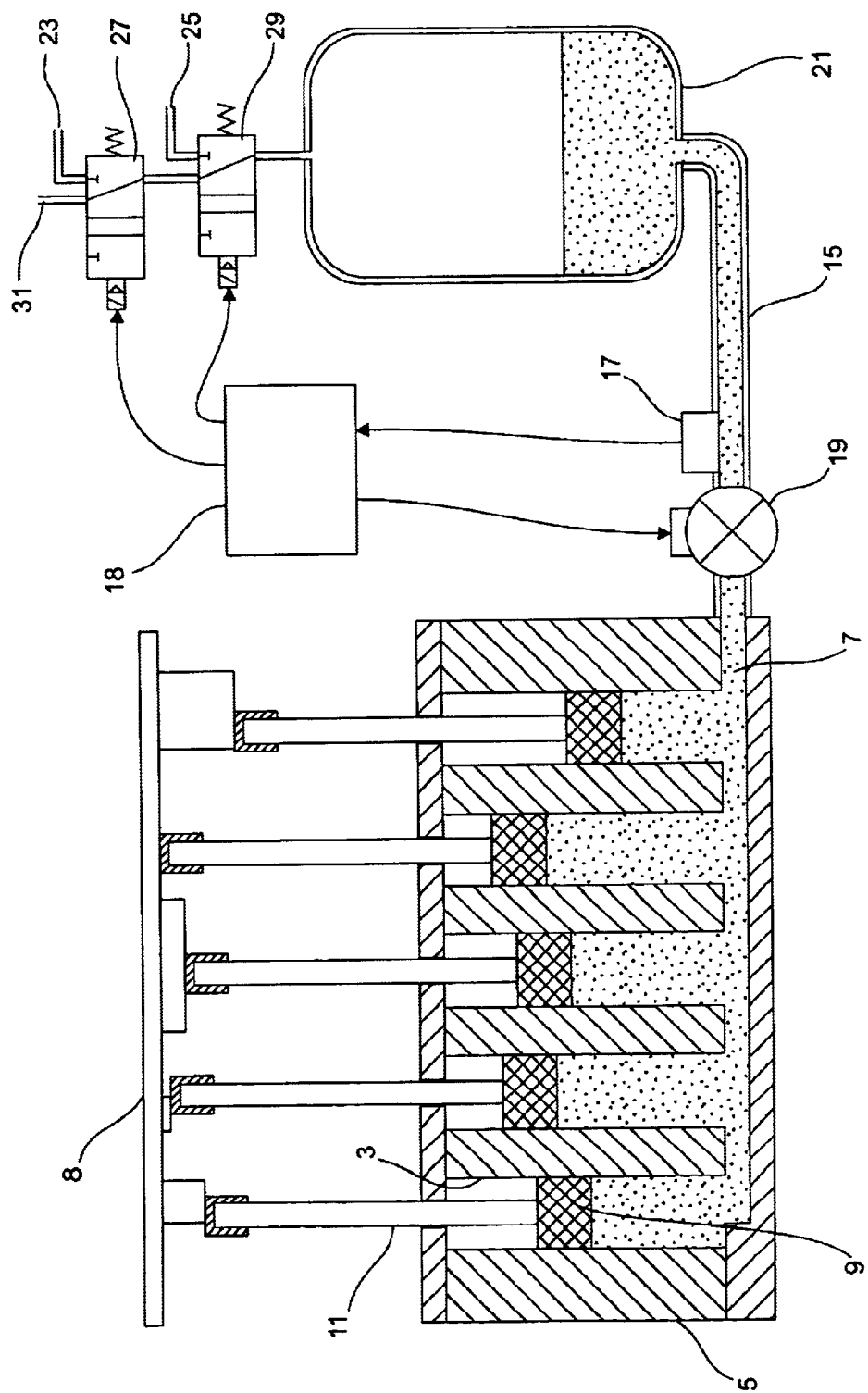

The sequence of operations for supporting a workpiece 8 with the tooling fixture 1 according to the invention is not limited to the one described in relation to FIGS. 3–5. Other sequences of operation can be used within the scope of the invention. For example, instead of extending the rods 11 until they all contact the workpiece 8, the rods 11 may first be all fully extended, with the tooling platform 6 starting in a lowered position. According to this embodiment the controller 18 opens the valve 19 and switches valve 29 to its first position and valve 27 to its second position so that the pistons 9 are driven to the top of cylinders 3. Valve 27 is then switched to its first position connecting the accumulator 21 with the atmospheric vent via tube 31. The controller 18 causes the platform 6 to rise so that, as each rod 11 contacts the workpiece 8, it pushes down the pistons 9 into cylinders 3, displacing fluid form cylinders 3 to the accumulator 21. Back pressure due to viscous flow of the fluid keeps the rods 11 extended until they are pushed down by the workpiece 8. When the platform 6 reaches its upper position the controller 18 closes valve 19, locking the rods 11 in position. After use, the platform 6 is lowered, enabling the workpiece 8 to be replaced by the next workpiece.

It should be noted that the tooling fixture 1 according to the invention is not configured before it encounters the workpiece 8. The configuration of the rods 11 will conform to the surface of the workpiece 8 regardless of the position or height of vertical features. As such, the tooling fixture 1 according to the invention will automatically adapt to each individual workpiece 8 irrespective of differences between types of workpieces.

Figure 6:
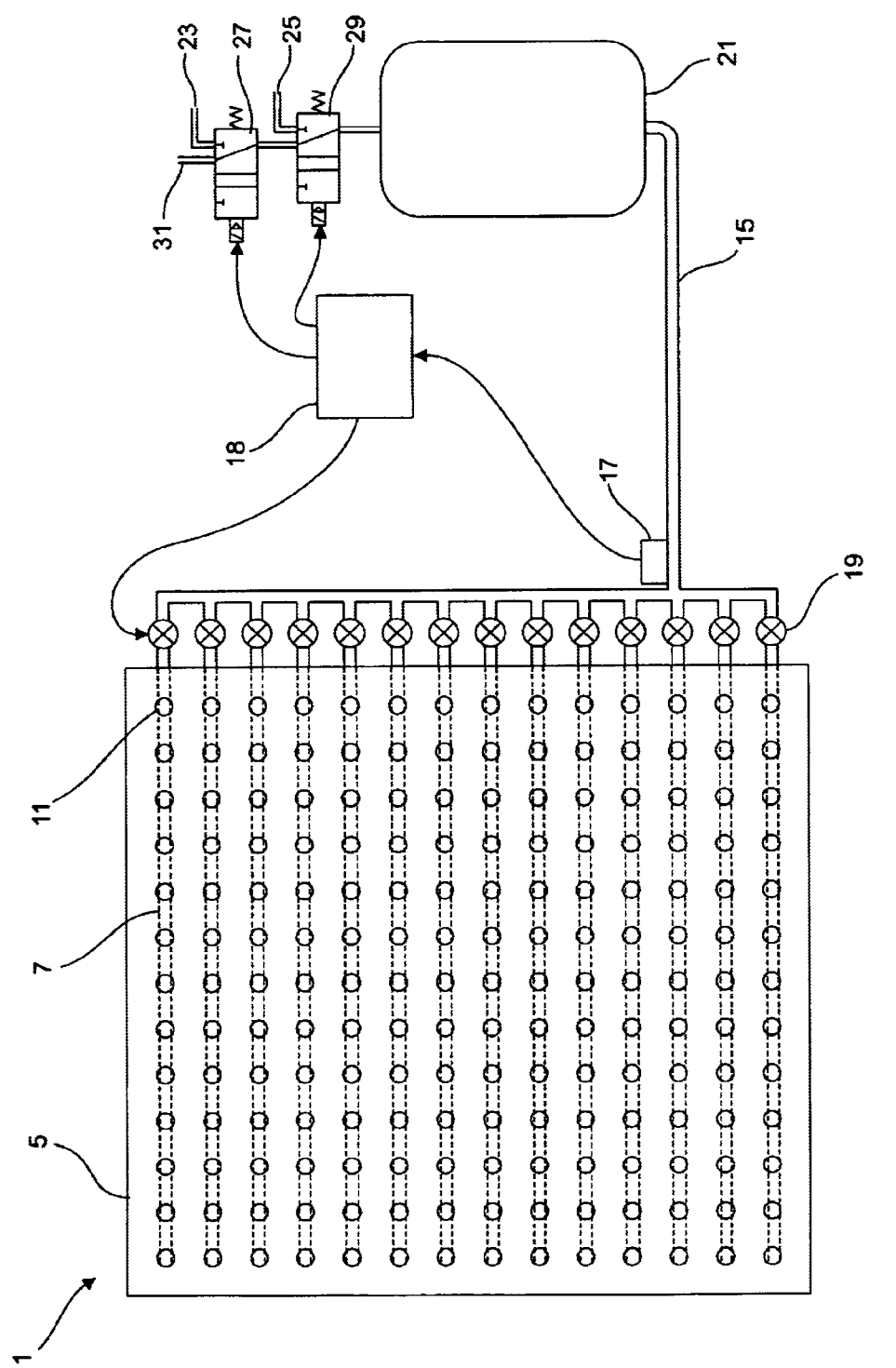
FIG. 6 is a top view of an alternative arrangement of the embodiment of FIG. 1

FIG. 6 shows an array of rods 11 arranged on a fixture block 5 of a tooling fixture 1 according to an embodiment of the invention. Each of the rods 11 are connected with piston 9 in a cylinder 3 arranged within the body of the block 5, as described according to the above embodiments. Each row of the cylinders 3 is connected to a manifold 7 and valve 19 that supplies fluid to each of the cylinders 3 in that row. According to this embodiment, when air pressure is applied to the accumulator 21, fluid moves from accumulator 21 into the cylinders 3 raising the rods 11. When all of the rods 11 have contacted the workpiece 8 the pressure sensed by pressure sensor 17 rises and the controller 18 simultaneously closes all valves 19. According to another embodiment of the invention, where workpiece 8 does not span all of the rows of rods 11, the controller 18 is programmed to hold the valves 19 for rows that are not under the workpiece 8 closed throughout the operation so that the rods 11 in those rows remain retracted within the block 5.

Figure 7:
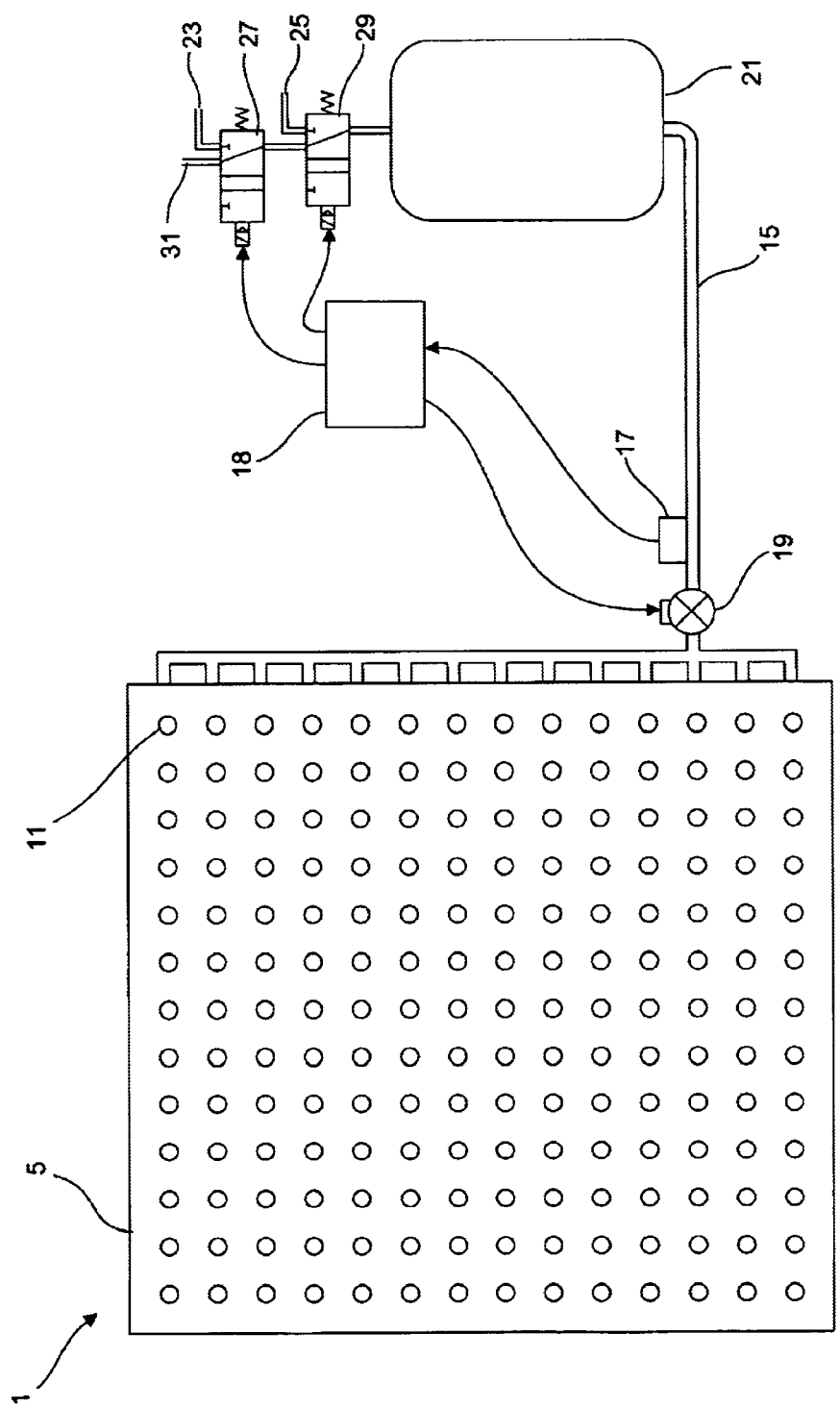
FIG. 7 is a top view of another alternative arrangement of the embodiment of FIG. 1.

FIG. 7 shows an array of rods 11 arranged on a fixture block 5 of a tooling fixture 1 according to a further embodiment of the invention. Each of the rods 11 are connected with a piston 9 in a cylinder 3 arranged within the body of the block 5, as described according to the above embodiments. The cylinders 3 are connected to a common manifold 7 that supplies fluid to each of the cylinders 3 simultaneously. This embodiment functions as above except that a single valve 19 controls the full array of rods 11. This embodiment is suitable for applications were relatively light force is applied for a short period such as exists in placement machines, as under these conditions, the stiffness of the system will prevent a single rod 11 or group of rods 11 being depressed, forcing fluid from their respective cylinders 3 into other cylinders 3 and causing the other rods 11 to rise. For applications such as screen printing where much higher forces are applied, the force is applied along the length of the print head and the previous arrangement, in which rows of rods 11, aligned along the length of the print head, are each controlled from a separate valve 19 is more suitable, as these valves 19 prevent fluid from one row moving to an alternative row and prevent depression of the rods 11.

Figure 8:
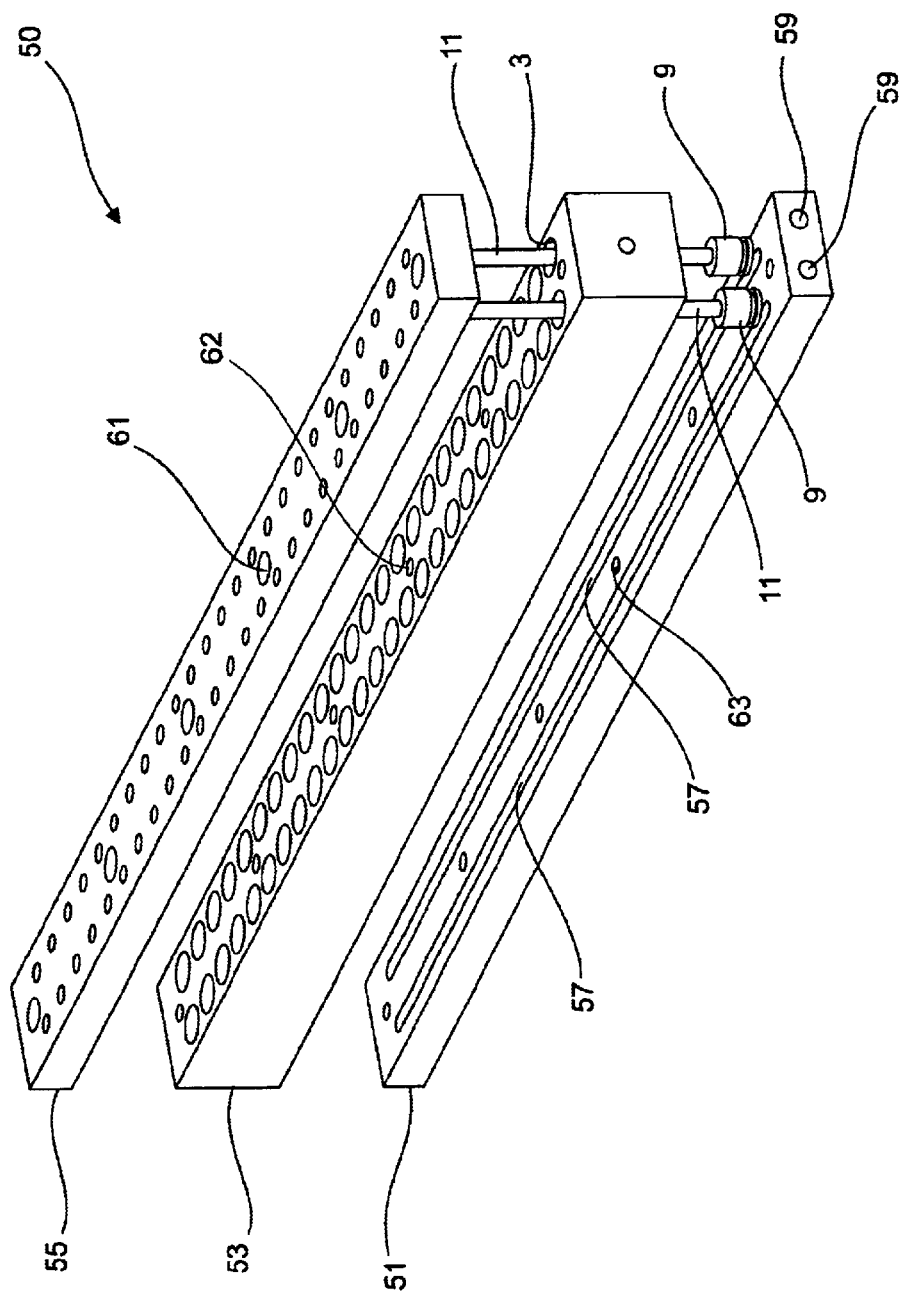
FIG. 8 is an exploded perspective view of a fixture block and piston according to another embodiment of FIG. 1.

FIG. 8 shows an exploded view of a block segment 50 according to another embodiment of the invention. The block segments 50, each contain two rows of rods 11 and a plurality of such block segments 50 can be bolted together to form an array of rods 11, as shown in FIGS. 6 or 7. The block segments 50, shown in FIG. 8 are each assembled from a manifold section 51, a cylinder section 53, and a top section 55. Grooves 57 are cut in the manifold section 51 to form the manifold 7. Outlet holes 59 are cut in the end of the manifold section 51 to intersect the grooves 57. These outlet holes 59 are connected with the valves 19, as shown in FIGS. 6 and 7. Cylinders 3 are provided through the cylinder section 53. Pistons 9 and rods 11 are inserted into the cylinder section 53. The rods 11 extend through holes in the top section 55. The manifold section 51, cylinder section 53 and top section 55 are fixed to one another together by screws (not shown) that pass through counter-bored holes 61 in top section 55, clearance holes 62 in cylinder section 53 and into threaded holes 63 in manifold section 51. A gasket (not shown) may be placed between manifold section 51 and cylinder section 53 to form a fluid-tight seal.

Figure 12:
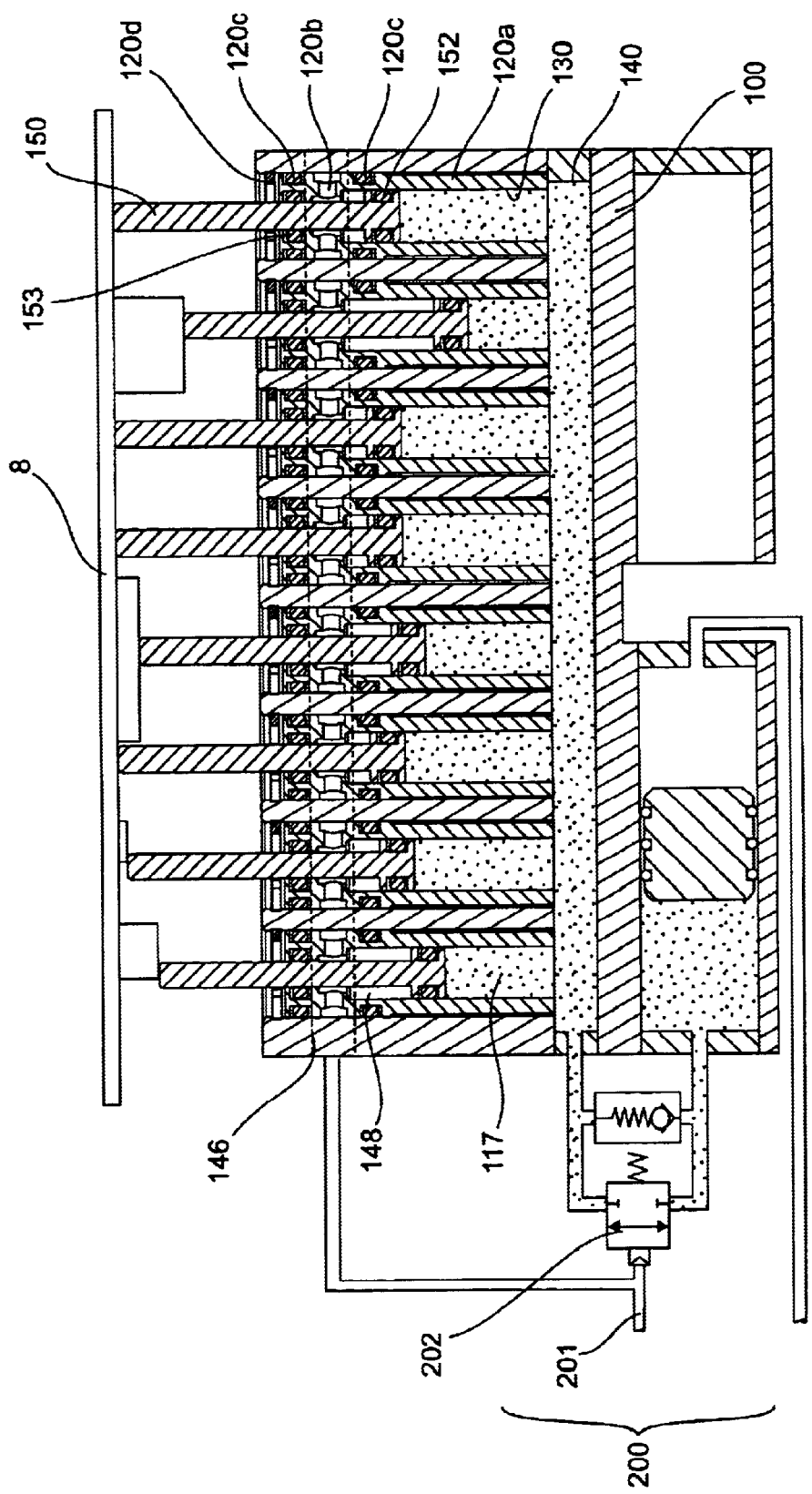
FIG. 12 is a sectional view of a first embodiment of a module 100 of the present invention through one row of support rods.

FIG. 9 shows a perspective view of a module 100 for a tooling fixture according to another embodiment of the invention. This module is shown, for purposes of illustration only, to contain two rows of support rods 150, with 16 rods in each row within its body 100a. FIG. 12 is a sectional view of the module 100 through one row of support rods 150 depicting the functioning and placement of the module's internal parts. Each rod has a piston 151 integrally connected at its lower end. Several bores (140a–140c) are formed lengthwise in the body 1OVA. The two bores 140a each form a manifold 140 for connecting the lower ends of a plurality of cylinders 120, and for enabling fluid to be introduced into the manifolds and each of the cylinders (see FIG. 9). The cylinders are each inserted into bored holes 155 formed vertically in the module body 100a and are retained therein by an internal C-clip 120d. Introduction of a fluid 117 into the module's manifold, via a control valve 200, creates a pressure in both the manifold 140 and the cylinder body 120a (below the rods) which acts on the pistons 151 to raise them along with their respective rods 150 individually. When the module is in its rest state (no fluid flows through control valve 200), the volume of fluid 117 is constrained within the manifold 140 and the lower portions of cylinders 120. At this point, although the individual rods 150 in each row may move with respect to each other to conform to variations in the workpiece 8, the workpiece is fully supported by the row of rods.

In order to set the rod heights for a new workpiece 8, it is first necessary to retract all of the rods 150 back into their respective cylinders 120. This is achieved by applying pneumatic pressure to control valve 202 and to the upper portions of cylinders 120 simultaneously. This in effect forces rods 150 back into cylinders 120 while also forcing the fluid 117 in the manifold 140 and cylinders 120 back into fluid reservoir 192, thus allowing rods 150 to fully retract back into the module body. FIG. 10 is a perspective view of one example of an individual cylinder 120 to be used and FIG. 11 is a perspective view of one example of a support rod 150 to be used in the cylinder. With this type of cylinder, each support rod 150 has a piston 151 formed at its lower end. FIG. 12 shows the cylinder as used in module 100. A first seal 152 provides a sliding fit between the piston 151 and an inner bore 130 of cylinder body 120a, while a second seal 153 is fitted inside the upper end of cylinder body 120a to form a sliding seal between each rod and cylinder body. The cylinder body 120a is open at its lower end in order to receive the rod 150 and piston 151 assembly and for introduction of fluid 117 therein to push up the piston 151 and extend the rod 150 from the upper end of the cylinder 120. The cylinder body 120a further includes a bottle-neck shaped portion at its upper end which appears as a groove from the exterior surface. surface. Within this groove shaped portion of the cylinder body are holes 120b that enable fluid to be introduced above the piston 151, pushing the piston down and retracting the rod back within the cylinder. Two O-ring seals 120c are located between the cylinder body 120a and a bore hole 155 in the module body 100a to prevent fluid from leaking out of the module or from between the upper and lower apertures in cylinder body 120a.

Figures 13, 16:
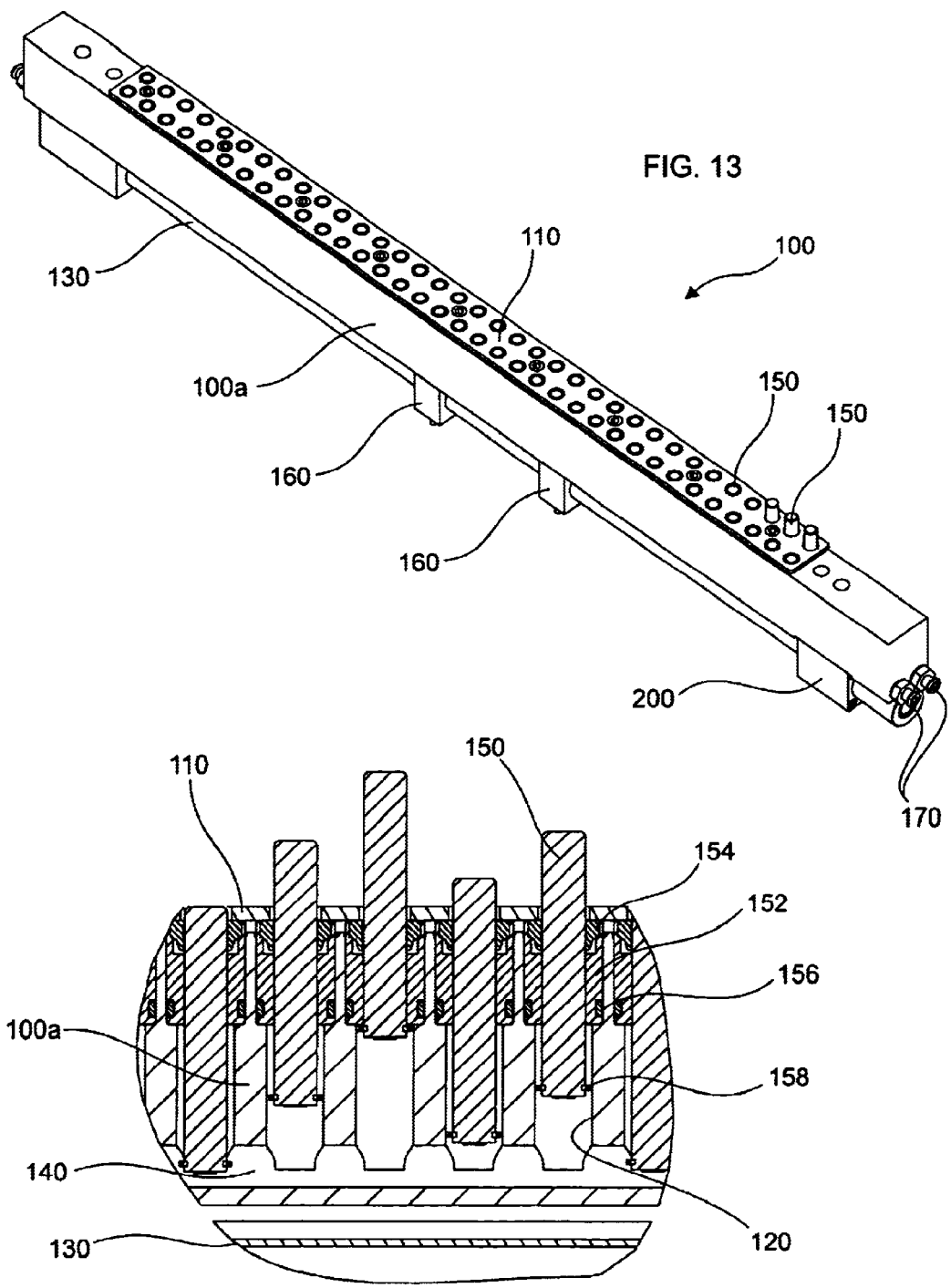
FIG. 13 is a perspective view of a second embodiment of a single module 100 of the present invention consisting of two rows of support rods 150.
FIG. 16 is a sectional view of the second embodiment of a module 100 of the present invention through one row of support rods.

FIG. 13 shows a preferred embodiment of a single module 100. In this embodiment, the rods 150 and their associated bearings and seals are retained in the module body 100a by a top plate 110. Beneath the body is a hydraulic tube 130 having fitted blocks 160 used to fix each module to the base of the tooling fixture. At one end of the tube 130 is a preferred design of control valve 200. Also shown as part of the module design are bleed valves 170 used for charging of the module's manifold 140 with fluid and further for elimination of air from the region being charged. FIG. 14 shows a plan view looking down on the module 100 and FIG. 15 is a partial sectional view of the module along the line A—A as provided in FIG. 14. In the latter view, it can be seen that the tube 130 has within it a main piston 132 at one end, while the control valve 200 is at its opposite end. A pneumatic connection 134 is formed at one end of the tube 130 before the main piston 132 for supplying pneumatic pressure to the tube.

This preferred embodiment works as follows. In order to raise the rods 150 from within the module body 100a, pneumatic pressure is applied to tube 130 by way of connection 134 (see FIG. 15). This in effect forces main piston 132 towards the hydraulic fluid contained within tube 130, thus forcing the fluid through control valve 200 and into the manifolds 140. As a result, the interconnected lower ends of each cylinder 120 fill up with the fluid and cause their respective rod 150 to be forced upward. Similarly, by applying vacuum to connection 134 instead of a positive pneumatic pressure, main piston 132 will be forced away from the fluid, drawing the fluid out of the manifolds 140 and cylinders 120, thus retracting the rods 150 back into their respective cylinders. FIG. 16 shows an enlarged and detailed view of a preferred embodiment of the rods 150 as identified by the area B in FIG. 15, while FIGS. 17 and 18 show an enlarged and detailed view of a preferred embodiment of the control valve 200 and its operation, as identified by area C in FIG. 15.

In FIG. 16 the module 100 shows the series of cylinders 120 extending from the upper surface of the horizontal manifolds 140 for receiving hydraulic fluid. The manifolds 140 are sealed at each end by bleed valves 170, and are directly linked to the control valve 200. Each of the cylinders includes an assembly consisting of rod 150, bearing 152, lip seal 154 and an O-ring seal 156. As mentioned previously, these cylinders are retained in position by the top plate 110. The O-rings 156 form a seal between bearings 152 and the cylinders 120. Each rod 150 has a precision sliding fit into bearing 152 such that the rods can be raised and lowered with very little applied force while at the same time preventing any leakage of fluid past the bearings. Any thin film of fluid that does pass through bearings 152 is then trapped by a wiping action of lip seals 154, also having a precision sliding fit with the rods. In order to limit the rod's upward travel in the event that it is not stopped at a lower level by contact with the workpiece to be supported, a retaining ring 158 is attached to the lower end of each rod 150.

Figure 17:
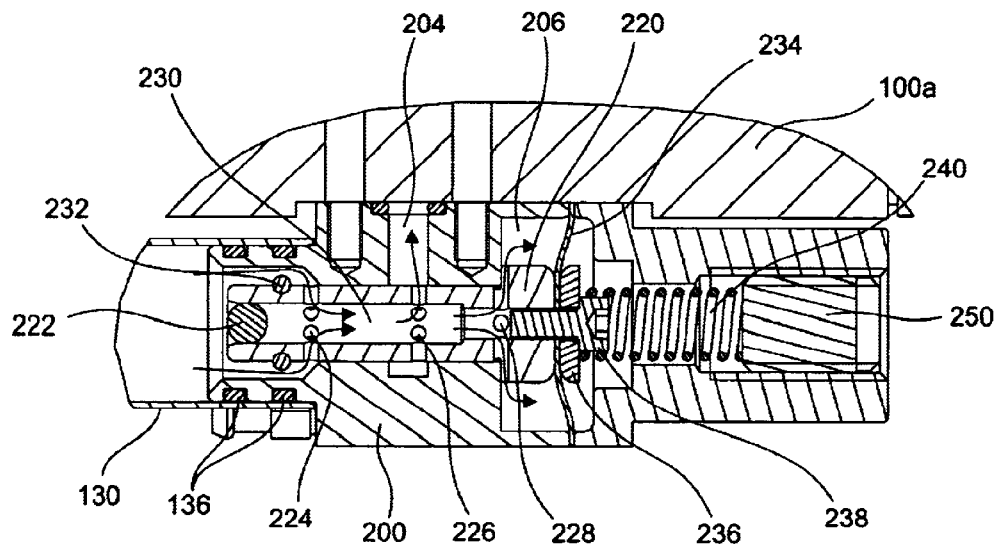
FIG. 17 is an enlarged detailed view of the control valve assembly 200 of FIG. 15 in the fully open position.
Figure 18:
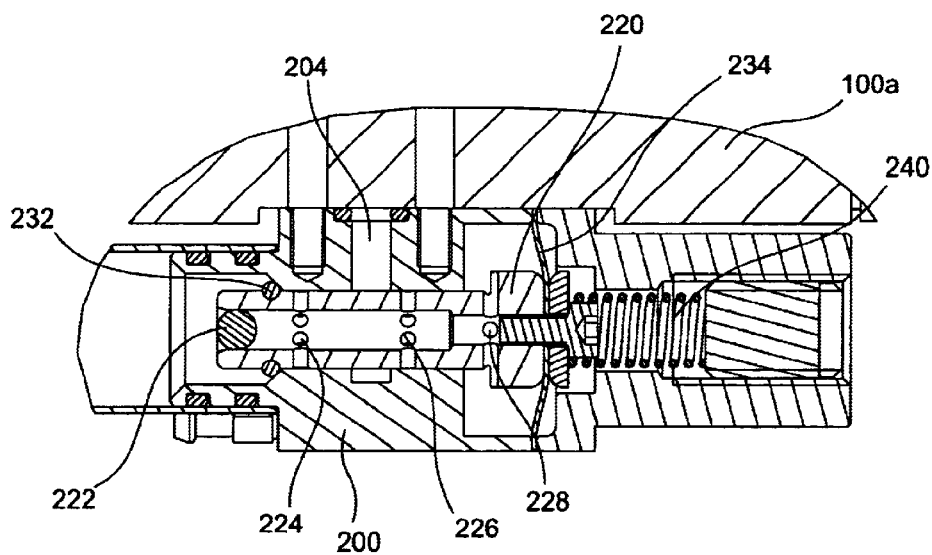
FIG. 18 is an enlarged detailed view of the control valve assembly 200 of FIG. 15 in the closed position.

A detailed view of the operation of control valve 200 in its preferred embodiment is shown in FIGS. 17 and 18. FIG. 17 shows the valve in its fully open position and FIG. 18 shows the valve in its closed position. The valve body 200 is coupled to one end of pneumatic tube 130 in a sealed fashion with the aid of two O-rings 136. Slidably mounted within the valve body is a piston 220. This piston has a hollow bore 230 running along its length, which is sealed at one end by a rigid ball 222 that is press-fit into the bore 230. Piston 220 is sealed at its opposite end by a screw 238 that further attaches a flexible diaphragm 234 thereto with the aid of a washer 236. A series of cross-drilled holes 224, 226 and 228 provide a path for fluid to flow from the piston's inner bore to the manifold 140 by way of a chamber 204 within valve body. A spring 240 is provided to apply a force to piston 220 in an opposite direction to the flow of fluid as shown in FIG. 17. A screw 250 enables adjustment of the force applied by the spring 240 to the piston 220.

The operation of the control valve works as follows. When pneumatic pressure is applied to main piston 132 in tube 130, fluid can pass from this tube through holes 224 into the inner bore of piston 220 as shown in FIG. 17. This fluid will then pass through holes 226 to chamber 204 and then into manifold 140 and cylinders 120, thus forcing the rods 150 upward. When all of the rods have made contact with the workpiece to be supported, or have reached their upper limit, no further fluid will pass into chamber 204 since the manifold and cylinders will not be able to take in any more fluid. As a result, the fluid pressure will start to rise. This rise in fluid pressure will be transmitted through holes 228 and into chamber 206 where it will act upon diaphragm 234 as well as acting on the sealed left-hand end of piston 220 (as shown in FIG. 18). When the force created by this pressure exceeds that of spring 240, the piston will overcome the force applied to it by the spring and the spring will begin to compress (see FIG. 18). As stated previously, the spring 240 is pre-tensioned by adjustment screw 250 so that when the force required to start compressing the spring has been exceeded, very little extra force is required to compress it to the position as shown in FIG. 18. In this position the holes 226 no longer allow fluid to flow into or out of chamber 204, effectively locking the rods 150 in their current position. To prevent any small leakage between the piston 220 and the valve body from causing any slow upward drift of the rods, an additional O-ring 232 is fitted in a groove in piston 220, forming a tight seal and preventing any fluid from passing out of tube 130. Therefore, as long as a relatively high pressure is maintained on piston 132, the rods will remain locked at their set heights and continue to support the workpiece.

When the pneumatic pressure applied to piston 132 is removed, the fluid pressure in tube 130 will drop and the force applied by spring 240 will return the piston to its open position. Application of vacuum applied to piston 132 can draw it away from the valve assembly, releasing fluid pressure and drawing piston 220 away from spring 240. This will cause the fluid to freely flow through the valve and back into tube 130, thus lowering the rods back into their respective cylinders. In this manner, it is evident that the fluid pressure applied to the rods 150 to raise them is limited by the force applied by spring 240, which can be set by selecting a suitable spring and by adjustment of screw 250.

Figure 19:
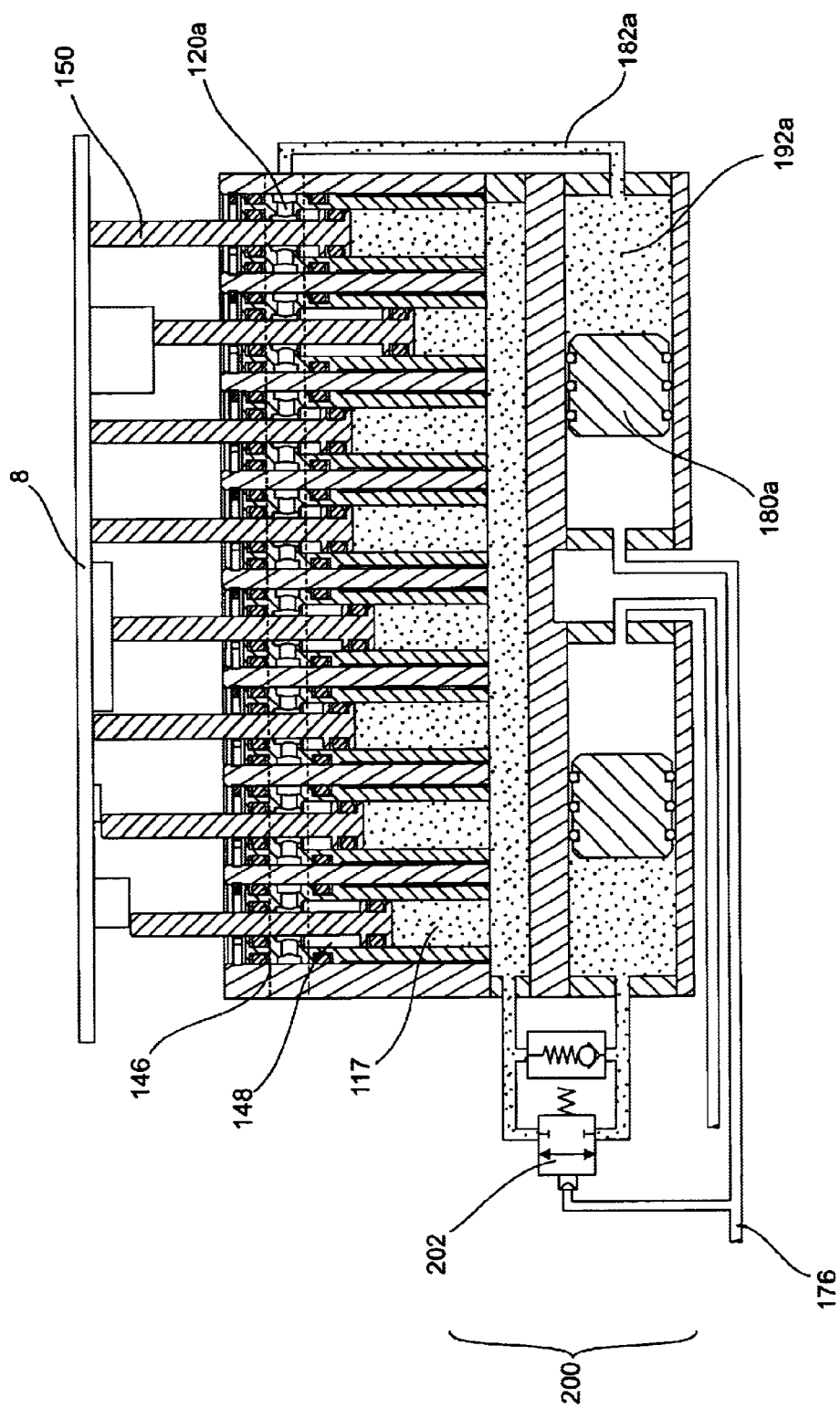
FIG. 19 is a sectional view of an alternative embodiment to the control valve and pneumatic pressure assembly of FIG. 12.
Figure 20:
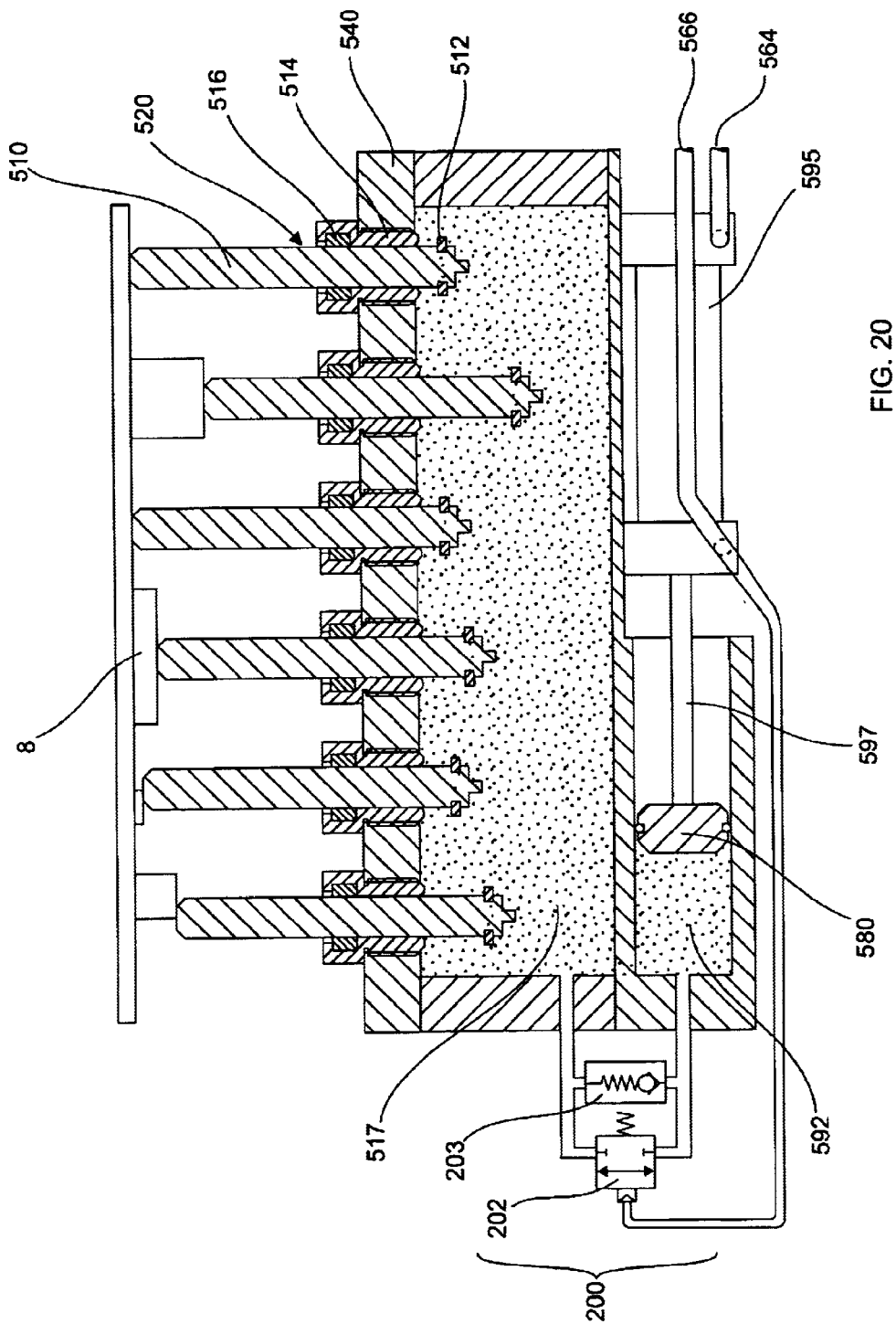
FIG. 20 is a sectional view of a further alternative embodiment to the control valve and pneumatic pressure assembly of FIG. 12.
Figure 21:
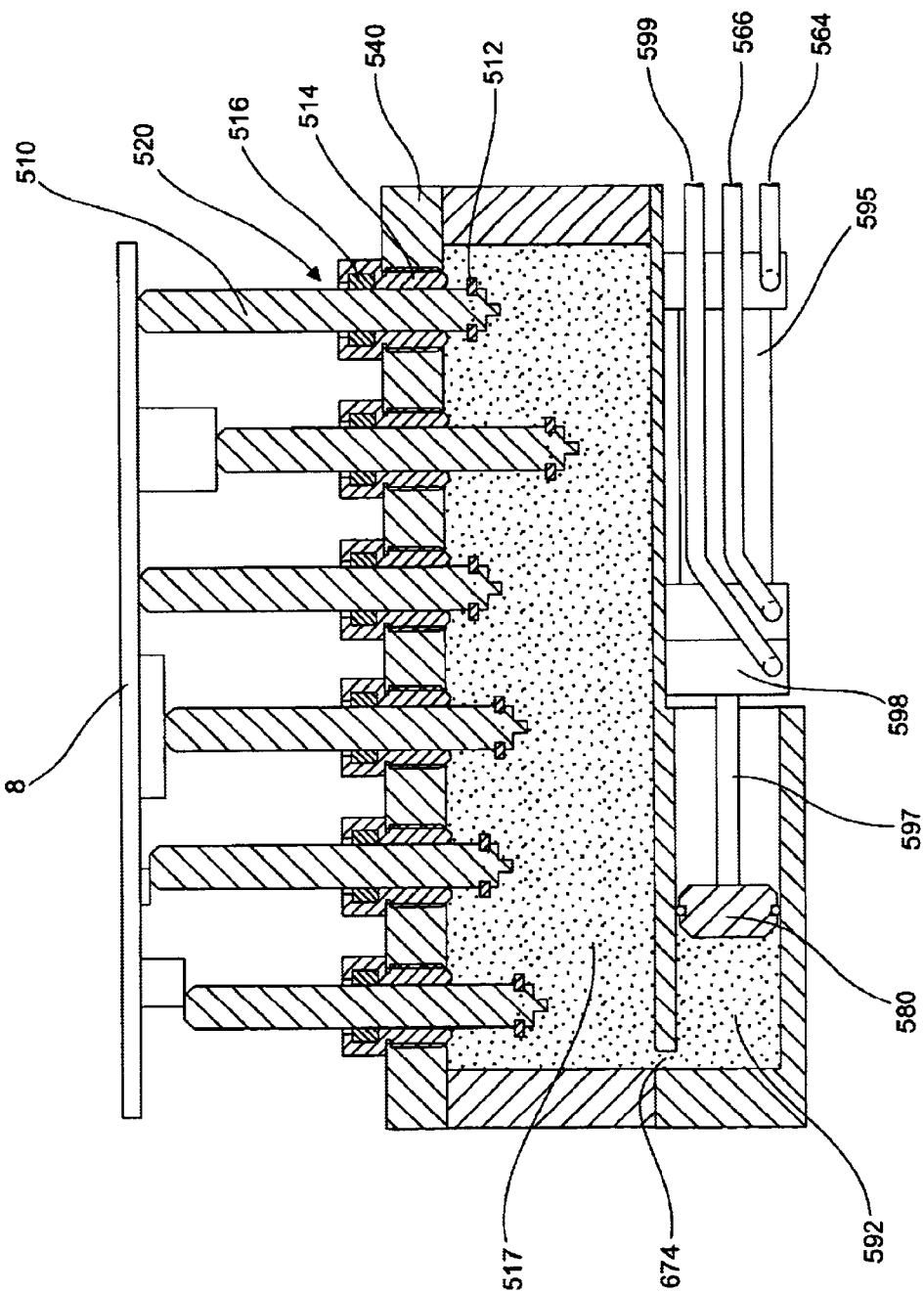
FIG. 21 is sectional view of yet another alternative embodiment to the control valve and pneumatic pressure assembly of FIG. 12.

FIGS. 19 through 21 provide alternative embodiments of tooling fixtures utilizing alternative valve assemblies and pneumatic pressure sources for controlling the raising and lowering of rods 150.

FIG. 19 shows an alternative embodiment of the tooling fixture of FIG. 12, including an additional reservoir unit and a second reservoir piston 180a located therein. In this embodiment, when retraction of the rods 150 is desired, pneumatic pressure is simultaneously applied to valve 202 and reservoir 192a via a pipe 176, which does not act directly on the pistons 151 as in FIG. 12 of the previous embodiment, but instead acts on second reservoir piston 180a to force fluid from a reservoir 192a through pipe 182a and to the upper portions of cylinders 120 via a manifold 146. Manifold 146 has apertures 120b that allow the fluid to enter a region 148 providing access to the upper portion of the cylinders 120, and hence the top portion of pistons 151. In effect, the fluid entering manifold 148 will create a pressure that will force the pistons in a downward direction, retracting the rods 150 back into their cylinders.

FIG. 20 shows yet another alterative embodiment of the tooling fixture of FIG. 12 in which cylinder assemblies 120 are replaced by rod assemblies 520 mounted in body 540, which has a large singular cavity 517 in place of the plurality of cylinders. Each rod assembly 520 consists of a support rod 510 fitted with a C-clip 512 near its lower end to restrict the extent of its upward movement. Furthermore, each rod 510 is mounted in a bearing 514 with a seal 516. These bearings have bores positioned axially through their centers such that the rods 510 have a close sliding relationship with these bores. The bores also have a groove in the upper diameter of the bearings for seating the seals 516. The seals are provided to form a tight contact with the rods to prevent any fluid from escaping out of the module body.

This system relies on the principle that in order to push a rod into cavity 517 it must displace some fluid, which in the system's rest state is prevented by a one-way check valve 203 and valve 202 which are connected in a parallel combination. In this embodiment pressure is not applied directly to retract the rods. Instead, a main piston 580 is connected to a rod 597 extending from pneumatic cylinder 595. Applying pneumatic pressure to a pipe 566 forces valve 202 to open which provides a path between cavity 517 and reservoir 592. Pipe 566 is also connected to the body of cylinder 595, which acts to retract rod 597 back into cylinder 595, pulling piston 580 along with it. As a result, fluid is drawn from cavity 517, causing rods 510 to retract into this same cavity. To extend the rods 510 out of cavity 517 pneumatic pressure is applied to the opposite end of pneumatic cylinder 595 via pneumatic pressure pipe 564, extending rod 597 out of cylinder 595 while moving piston 580 toward the fluid within the reservoir, forcing the fluid through check valve 203 and into cavity 517, extending the rods 510 upwards and out of module body 540.

FIG. 21 shows still a further alternative embodiment of the tooling fixture of FIG. 12 in which the valve assembly 200 has been replaced by a permanent aperture 674 positioned between the cavity 517 and fluid reservoir 592. A clamp 598 acts on rod 597 to restrict movement of the rod and its attached piston 580, thus constraining the volume of fluid in cavity 517 at a certain level. In this embodiment, whenever pneumatic pressure is applied to pipes 564 or 566 to move the rod 597 and piston 580 combination towards or away from the fluid contained within reservoir 592 respectively, pneumatic pressure must also be applied to pipe 599 to release clamp 598 from holding rod 597 in a locked position and therefore allow the piston and rod to move freely.

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. A tooling fixture for supporting workpieces, lower surfaces of ones of which have features of different heights, comprising:
    a body including a plurality of cylinder bores, at least one support fluid manifold fluidly connected to the cylinder bores, and a surface over which a workpiece is in use supported;
    a plurality of supporting elements for supporting the workpiece, the supporting elements being slideably disposed in respective ones of the cylinder bores such that at least ones of the supporting elements are moved to assume different heights from the surface of the body when adopting a supporting position in conforming contact with a lower surface of the workpiece;
    at least one support fluid reservoir for containing support fluid and operably fluidly connected to the at least one support fluid manifold such as to provide for displacement of support fluid between the at least one support fluid reservoir and the at least one support fluid manifold on sliding of at least ones of the supporting elements in adopting the supporting position; and
    a flow control unit for enabling displacement of support fluid between the at least one support fluid reservoir and the at least one support fluid manifold such as to enable the supporting elements to adopt the supporting position, with at least ones of the supporting elements being moved such that at least ones of the supporting elements, from a position not in conforming contact with the lower surface of the workpiece, assume the supporting position in conforming contact with the lower surface of the workpiece in which ones of the supporting elements assume different heights from others of the supporting elements in conformance with features on the lower surface of the workpiece, and locking the supporting elements when in the supporting position.

2. The tooling fixture of claim 1, wherein the flow control unit is configured to displace support fluid from the at least one support fluid reservoir to the at least one support fluid manifold such as to cause the supporting elements to be extended to adopt the supporting position in conforming contact with the workpiece, with at least ones of the supporting elements being raised to different heights in conformance with features on a lower surface of the workpiece.

3. The tooling fixture of claim 1, wherein the flow control unit is configured to cause displacement of support fluid from the at least one support fluid reservoir to the at least one support fluid manifold such as to cause the supporting elements to be extended to an extended position, and subsequently allow displacement of support fluid from the at least one support fluid manifold to the at least one support fluid reservoir such as to allow at least ones of the supporting elements to be lowered to adopt the supporting position in conforming contact with the workpiece, with at least ones of the supporting elements being lowered to different heights in conformance with features on a lower surface of the workpiece.

4. The tooling fixture of claim 1, wherein the flow control unit includes a positive pneumatic pressure source operably fluidly connected to the at least one support fluid reservoir for displacing support fluid from the at least one support fluid reservoir to the at least one support fluid manifold such as to extend the supporting elements.

5. The tooling fixture of claim 4, wherein the flow control unit includes a vacuum source operably fluidly connected to the at least one support fluid reservoir for displacing support fluid from the at least one support fluid manifold to the at least one support fluid reservoir such as to retract the supporting elements.

6. The tooling fixture of claim 4, wherein the pneumatic pressure source is configured to exert a predeterminable pressure to the support fluid corresponding to a force to be exerted by the supporting elements on the workpiece.

7. The tooling fixture of claim 1, wherein the at least one support fluid reservoir comprises a fixed volume accumulator operably fluidly connected at a bottom end with the at least one support fluid manifold, and the flow control unit includes a positive pneumatic pressure source operably fluidly connected to a top end of the accumulator for applying a positive pneumatic pressure to the contained support fluid such as to displace support fluid from the accumulator to the at least one support fluid manifold such as to extend the supporting elements.

8. The tooling fixture of claim 7, wherein the flow control unit includes a vacuum source operably fluidly connected to a top end of the accumulator for applying a negative pneumatic pressure to the contained support fluid to displace support fluid from the at least one support fluid manifold to the accumulator such as to retract the supporting elements.

9. The tooling fixture of claim 8, wherein the flow control unit includes first and second control valves operable selectively to fluidly connect one of the positive pneumatic pressure source and the vacuum source to the accumulator.

10. The tooling fixture of claim 9, wherein the first control valve comprises a three-port valve fluidly connected to the accumulator, the vacuum source and the second control valve, the first control valve being operable to fluidly connect the accumulator to one of the vacuum source or the second control valve, and the second control valve comprises a three-port valve fluidly connected to the first control valve, the positive pneumatic pressure source and atmosphere, the second control valve being operable, with the first control valve fluidly connecting the accumulator to the second control valve, to fluidly connect the accumulator to one of the positive pneumatic pressure source or atmosphere.

11. The tooling fixture of claim 1, wherein the flow control unit includes at least one drive piston assembly comprising a support fluid drive piston slideably disposed in the respective at least one support fluid reservoir and a drive unit for sliding the support fluid drive piston in the respective at least one support fluid reservoir.

12. The tooling fixture of claim 11, wherein the support fluid drive piston comprises a floating piston.

13. The tooling fixture of claim 12, wherein the drive unit includes a positive pressure source operably fluidly connected to the respective at least one support fluid reservoir at a location, with respect to the support fluid drive piston, opposite the fluid connection between the respective at least one support fluid reservoir and the at least one support fluid manifold such as to slide the support fluid drive piston to displace support fluid from the respective at least one support fluid reservoir to the at least one support fluid manifold and thereby extend the supporting elements.

14. The tooling fixture of claim 13, wherein the positive pressure source comprises a pneumatic pressure source.

15. The tooling fixture of claim 13, wherein the drive unit includes a negative pressure source operably fluidly connected to the at least one support fluid reservoir at a location, with respect to the support fluid drive piston, opposite the fluid connection between the at least one support fluid reservoir and the at least one support fluid manifold such as to slide the support fluid drive piston to displace support fluid from the at least one support fluid manifold to the at least one support fluid reservoir and thereby retract the supporting elements.

16. The tooling fixture of claim 15, wherein the negative pressure source comprises a vacuum source.

17. The tooling fixture of claim 11, wherein the drive unit comprises a hydraulic cylinder connected to the support fluid drive piston via a connecting rod such as to drive the connecting rod selectively in a first direction to displace support fluid from the respective at least one support fluid reservoir to the respective at least one support fluid manifold and thereby extend the supporting elements, and a second, opposite direction to displace support fluid from the respective at least one support fluid manifold to the respective at least one support fluid reservoir and thereby retract the supporting elements.

18. The tooling fixture of claim 11, wherein the drive unit comprises a pneumatic cylinder connected to the support fluid drive piston via a connecting rod such as to drive the connecting rod selectively in a first direction to displace support fluid from the respective at least one support fluid reservoir to the respective at least one support fluid manifold and thereby extend the supporting elements, and a second, opposite direction to displace support fluid from the respective at least one support fluid manifold to the respective at least one support fluid reservoir and thereby retract the supporting elements.

19. The tooling fixture of claim 18, wherein the pneumatic cylinder includes pneumatic connections at opposite ends thereof for enabling the connecting rod to be driven selectively in the opposite directions on application of a pneumatic pressure thereto, and the flow control unit includes a first pneumatic pressure source operably fluidly connected to one fluid connection of the pneumatic cylinder to slide the support fluid drive piston in the first direction to displace support fluid from the respective at least one support fluid reservoir to the respective at least one support fluid manifold and thereby extend the supporting elements, and a second pneumatic pressure source operably fluidly connected to the other fluid connection of the pneumatic cylinder to slide the support fluid drive piston in the other, second direction so as to displace support fluid from the respective at least one support fluid manifold to the respective at least one support fluid reservoir and thereby retract the supporting elements.

20. The tooling fixture of claim 18, wherein the pneumatic cylinder includes a clamp operable between a first, clamped state in which the clamp clamps the connecting rod to prevent operation of the pneumatic cylinder and a second, open state in which the connecting rod is freely movable and the pneumatic cylinder is operable.

21. The tooling fixture of claim 20, wherein the clamp is a pneumatically-actuated clamp normally in the clamped state and operable to the open state on application of a pneumatic actuation pressure thereto.

22. The tooling fixture of claim 11, wherein the drive unit is configured to exert a predeterminable pressure to the support fluid corresponding to a force to be exerted by the supporting elements on the workpiece.

23. The tooling fixture of claim 18, wherein the pneumatic cylinder includes pneumatic connections at opposite ends thereof for enabling the connecting rod to be driven in opposite directions on application of a pneumatic pressure thereto, the flow control unit includes at least one valve unit operably fluidly connecting at least one of the at least one support fluid reservoir and at least one of the at least one support fluid manifold, the or each valve unit including first and second valves disposed in parallel combination and operably fluidly connecting the respective at least one support fluid reservoir and the respective at least one support fluid manifold, the first valve being a one-way check valve configured to allow for flow of support fluid from the respective at least one support fluid reservoir to the respective at least one support fluid manifold and the second valve being a pneumatically-actuated valve operable to fluidly connect the respective at least one support fluid manifold to the respective at least one support fluid reservoir such as to allow for flow of support fluid from the respective at least one support fluid manifold to the respective at least one support fluid reservoir, a first pneumatic pressure source operably fluidly connected to one fluid connection of the pneumatic cylinder to slide the support fluid drive piston such as to displace support fluid from the respective at least one support fluid reservoir to the respective at least one support fluid manifold and thereby extend the supporting elements, and a second pneumatic pressure source operably fluidly connected both to the other fluid connection of the pneumatic cylinder and the second valve such as simultaneously to actuate the second valve to fluidly connect the respective at least one support fluid manifold to the respective at least one support fluid reservoir and slide the support fluid drive piston such to displace support fluid from the respective at least one support fluid manifold to the respective at least one support fluid reservoir and thereby retract the supporting elements.

24. The tooling fixture of claim 1, wherein the flow control unit includes at least one valve unit operably fluidly connecting at least one of the at least one support fluid reservoir and at least one of the at least one support fluid manifold.

25. The tooling fixture of claim 24, wherein the or each valve unit comprises a pressure-sensitive shut-off valve configured automatically to close and prevent displacement of support fluid between the respective at least one fluid support reservoir and the respective at least one fluid support manifold when the pressure exerted by the support fluid exceeds a predetermined value.

26. The tooling fixture of claim 25, wherein the shut-off valve comprises a piston body including a first port fluidly connected to the respective at least one fluid support reservoir and a second port fluidly connected to the respective at least one fluid support manifold, a piston unit slideably disposed in the piston body between a first, open position in which a fluid connection is provided between the first and second ports and a second, closed position in which no fluid connection is provided between the first and second ports, a biasing element for normally biasing the piston unit to the open position and having a biasing force which is such that the piston unit assumes the closed position when the pressure exerted by the support fluid exceeds a predetermined value, and a diaphragm seal sealingly connecting the piston unit to the piston body.

27. The tooling fixture of claim 26, wherein the piston unit includes a piston including a cavity and at least two sets of radial bores fluidly connected to the cavity and disposed such as to provide a fluid connection between the first and second ports through the axial bore when the piston unit is in the open position and provide no fluid connection between the first and second ports when the piston unit is in the closed position.

28. The tooling fixture of claim 27, wherein the cavity in the piston comprises a hollow bore closed at one end by a rigid ball.

29. The tooling fixture of claim 26, wherein the shut-off valve further comprises a screw adjuster for enabling adjustment of the biasing force of the biasing element.

30. The tooling fixture of claim 24, wherein the or each valve unit includes a valve fluidly connecting the respective at least one support fluid reservoir and the respective at least one support fluid manifold for-controlling flow of support fluid therebetween, and the flow control unit includes a pressure sensor fluidly connected to the at least one support fluid manifold for detecting the pressure exerted by the support fluid, and a controller operably fluidly connected to the pressure sensor and the valve such as to close the valve when the pressure exerted by the support fluid exceeds a predetermined value.

31. The tooling fixture of claim 24, wherein the or each valve unit includes first and second valves disposed in parallel combination and operably fluidly connecting the respective at least one fluid support reservoir and the respective at least one fluid support manifold, the first valve being a one-way check valve configured to allow for flow of support fluid from the respective at least one support fluid reservoir to the respective at least one support fluid manifold and the second valve being operable to fluidly connect the respective at least one support fluid manifold to the respective at least one support fluid reservoir such as to allow for flow of support fluid from the respective at least one support fluid manifold to the respective at least one support fluid reservoir.

32. The tooling fixture of claim 31, wherein the second valve is a pneumatically-actuated valve.

33. The tooling fixture of claim 32, wherein the flow control unit includes a pneumatic pressure source operably fluidly connected to the second valve to actuate the same and thereby extend the supporting elements.

34. The tooling fixture of claim 24, wherein the body includes at least one return fluid manifold fluidly connecting the cylinder bores, the cylinder bores being fluidly connected at one end to the respective at least one supply fluid manifold and at another end to the respective at least one return fluid manifold, and the flow control unit includes at least one valve unit operably fluidly connecting at least one of the at least one support fluid reservoir and at least one of the at least one support fluid manifold, the or each valve unit including first and second valves disposed in parallel combination and operably fluidly connecting the respective at least one support fluid reservoir and the respective at least one support fluid manifold, the first valve being a one-way check valve configured to allow for flow of support fluid from the respective at least one support fluid reservoir to the respective at least one support fluid manifold and the second valve being a pneumatically-actuated valve operable to fluidly connect the respective at least one support fluid manifold to the respective at least one support fluid reservoir such as to allow for flow of support fluid from the respective at least one support fluid manifold to the respective at least one support fluid reservoir, a pneumatic pressure source operably fluidly connected both to the respective at least one return fluid manifold and the second valve such as simultaneously to actuate the second valve to fluidly connect the respective at least one support fluid manifold to the respective at least one support fluid reservoir and introduce return fluid into the respective at least one return fluid manifold such as to retract the supporting elements and displace support fluid from the respective at least one support fluid manifold to the respective at least one support fluid reservoir.

35. The tooling fixture of claim 24, wherein the body includes at least one return fluid manifold fluidly connecting the cylinder bores, the cylinder bores being fluidly connected at one end to the respective at least one supply fluid manifold and at another end to the respective at least one return fluid manifold, further comprising: at least one positive pressure supply unit operably fluidly connected to at least one of the at least one return fluid manifold to retract the supporting elements, the or each positive pressure supply unit comprising a return fluid reservoir for containing a return fluid, a return fluid drive piston slideably disposed in the return fluid reservoir, and a positive pneumatic pressure source fluidly connected to the return fluid reservoir at a location, with respect to the return fluid drive piston, opposite the connection between the return fluid reservoir and the respective at least one return fluid manifold, and the flow control unit includes at least one valve unit operably fluidly connecting at least one of the at least one support fluid reservoir and at least one of the at least one support fluid manifold, the or each valve unit including first and second valves disposed in parallel combination and operably fluidly connecting the respective at least one support fluid reservoir and the respective at least one support fluid manifold, the first valve being a one-way check valve configured to allow for flow of support fluid from the respective at least one support fluid reservoir to the respective at least one support fluid manifold and the second valve being a pneumatically-actuated valve operable to fluidly connect the respective at least one support fluid manifold to the respective at least one support fluid reservoir such as to allow for flow of support fluid from the respective at least one support fluid manifold to the respective at least one support fluid reservoir, and a pneumatic pressure source operably fluidly connected both to the return fluid reservoir and the second valve such as simultaneously to actuate the second valve to fluidly connect the respective at least one support fluid manifold to the respective at least one support fluid reservoir and slide the return fluid drive piston to displace return fluid from the return fluid reservoir to the respective at least one return fluid manifold such as to retract the supporting elements and displace support fluid from the respective at least one support fluid manifold to the respective at least one support fluid reservoir.

36. The tooling fixture of claim 1, wherein the body includes a plurality of rows of cylinder bores and one support fluid manifold fluidly connected thereto.

37. The tooling fixture of claim 36, comprising:
one support fluid reservoir operably fluidly connected to the one support fluid manifold.

38. The tooling fixture of claim 37, wherein the flow control unit includes one valve unit operably fluidly connecting the one support fluid reservoir and the one support fluid manifold.

39. The tooling fixture of claim 1, wherein the body includes a plurality of rows of cylinder bores and a plurality of support fluid manifolds each fluidly connected to a plurality of the rows of cylinder bores.

40. The tooling fixture of claim 39, comprising:
one support fluid reservoir operably fluidly connected to the support fluid manifolds.

41. The tooling fixture of claim 40, wherein the flow control unit includes one valve unit operably fluidly connecting the one support fluid reservoir and each support fluid manifold.

42. The tooling fixture of claim 40, wherein the flow control unit includes a plurality of valve units each operably fluidly connecting the one support fluid reservoir to each respective one of the support fluid manifolds.

43. The tooling fixture of claim 39, comprising:
a plurality of support fluid reservoirs each fluidly connected to a respective one of the support fluid manifolds.

44. The tooling fixture of claim 43, wherein the flow control unit includes a plurality of valve units each operably fluidly connecting respective ones of the support fluid reservoirs and the support fluid manifolds.

45. The tooling fixture of claim 1, wherein the body includes a plurality of rows of cylinder bores and a plurality of support fluid manifolds each fluidly connected to a respective one of the rows of cylinder bores.

46. The tooling fixture of claim 45, comprising:
one support fluid reservoir operably fluidly connected to the support fluid manifolds.

47. The tooling fixture of claim 46, wherein the flow control unit includes a plurality of valve units each operably fluidly connecting the one support fluid reservoir to a respective one of the support fluid manifolds.

48. The tooling fixture of claim 45, comprising:
a plurality of support fluid reservoirs each fluidly connected to a respective one of the support fluid manifolds.

49. The tooling fixture of claim 48, wherein the flow control unit includes a plurality of valve units each operably fluidly connecting respective ones of the support fluid reservoirs and the support fluid manifolds.

50. The tooling fixture of claim 1, wherein the body includes at least one return fluid manifold fluidly connecting the cylinder bores, the cylinder bores being fluidly connected at one end to the respective at least one supply fluid manifold and at another end to the respective at least one return fluid manifold, and further comprising:
at least one positive pressure supply unit operably fluidly connected to at least one of the at least one return fluid manifold to return the supporting elements to a retracted position.

51. The tooling fixture of claim 50, wherein the or each at least one positive pressure supply unit comprises a positive pressure source.

52. The tooling fixture of claim 51, wherein the positive pressure source comprises a pneumatic pressure source.

53. The tooling fixture of claim 50, wherein the or each positive pressure supply unit comprises a return fluid reservoir for containing a return fluid, a return fluid drive piston slideably disposed in the return fluid reservoir, and a positive pressure source fluidly connected to the return fluid reservoir at a location, with respect to the return fluid drive piston, opposite the connection between the return fluid reservoir and the respective at least one return fluid manifold.

54. The tooling fixture of claim 53, wherein the return fluid drive piston comprises a floating piston.

55. The tooling fixture of claim 53, wherein the positive pressure source comprises a pneumatic pressure source.

56. The tooling fixture of claim 1, wherein the or each supply fluid reservoir comprises a cavity in the body.

57. The tooling fixture of claim 1, wherein the or each reservoir comprises a tube integrally attached to the body.

58. The tooling fixture of claim 1, wherein the supporting elements each comprise a piston and a rod of lesser diameter than the piston secured to the piston.

59. The tooling fixture of claim 1, wherein the supporting elements each comprise a rod.

60. The tooling fixture of claim 1, wherein the body includes a plurality of cylinder sleeve assemblies disposed in respective ones of the cylinder bores and in which respective ones of the supporting elements are slideably disposed.

61. The tooling fixture of claim 1, wherein the supporting elements each include an end cap fixed to an end thereof.

62. The tooling fixture of claim 1, wherein the body comprises a body section including a plurality of cylinder bores therethrough, a lower section fixed to a lower surface of the body section and including at least one channel along an upper surface thereof and at least one outlet hole fluidly connected to the at least one channel, the at least one channel defining the at least one fluid supply manifold, and an upper section mounted to an upper surface of the body section, the upper section including a plurality of apertures therein in registration with the cylinder bores in the body section through which respective ones of the supporting elements are extendable.

63. The tooling fixture of claim 62, wherein the body further comprises a gasket disposed between the body section and the lower section.

64. The tooling fixture of claim 1, wherein the body comprises at least one module, and further comprising a base on which the body is mountable.

65. The tooling fixture of claim 64, wherein the body comprises a plurality of support modules, each including at least one row of cylinder bores.

66. A screen printing machine comprising the tooling fixture of claim 1 and a printed circuit board disposed proximate to the surface of the body thereof.

67. A placement machine comprising the tooling fixture of claim 1 and a printed circuit board disposed proximate to the surface of the body thereof.

* * * * *